United States Patent
Lai et al.

(10) Patent No.: US 11,751,407 B2
(45) Date of Patent: Sep. 5, 2023

(54) 3D MEMORY WITH CONFINED CELL

(71) Applicant: MACRONIX INTERNATIONAL CO., LTD., Hsinchu (TW)

(72) Inventors: Erh-Kun Lai, Tarrytown, NY (US); Hsiang-Lan Lung, Ardsley, NY (US)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 101 days.

(21) Appl. No.: 17/154,615

(22) Filed: Jan. 21, 2021

(65) Prior Publication Data

US 2021/0143216 A1    May 13, 2021

Related U.S. Application Data

(62) Division of application No. 16/014,346, filed on Jun. 21, 2018, now Pat. No. 10,937,832.

(51) Int. Cl.
  *H01L 21/77* (2017.01)
  *H10B 63/00* (2023.01)
  (Continued)

(52) U.S. Cl.
  CPC ......... *H10B 63/82* (2023.02); *G11C 13/0004* (2013.01); *H10B 63/84* (2023.02); *H10N 70/231* (2023.02); *G11C 2213/71* (2013.01)

(58) Field of Classification Search
  CPC . H01L 27/2472; H01L 27/2481; H01L 45/06; H01L 27/2427; H01L 27/2463;
  (Continued)

(56) References Cited

U.S. PATENT DOCUMENTS 6,579,760 B1    6/2003   Lung
7,538,043 B2    5/2009   Lee
  (Continued)

FOREIGN PATENT DOCUMENTS

CN    107482034 A    12/2017
TW    200802809 A    1/2008
  (Continued)

OTHER PUBLICATIONS

Czubatyi, et al. "Invited Paper: Thin-Film Ovonic Threshold Switch: Its Operation and Application in Modern Integrated Circuits," Electron. Mater. Lett.vol. 8, No. 2, Apr. 29, 2012, 11 pages.
  (Continued)

*Primary Examiner* — Samuel Park
(74) *Attorney, Agent, or Firm* — Korbin S Van Dyke; Haynes Beffel & Wolfeld LLP

(57) ABSTRACT

A plurality of memory cells in a cross-point array in which the memory cell stacks in the cross-points include a switch element, a conductive barrier layer, and a confined cell structure in series, and having sides aligned within the cross-point area of the corresponding cross-point, the confined cell structure including surfactant spacers within the cross-point area having outside surfaces on a pair of opposing sides of the stack, and a body of programmable resistance memory material confined between inside surfaces of the surfactant spacers. The memory cells can be operated as multi-level cells in a 3D array.

11 Claims, 15 Drawing Sheets

(51) Int. Cl.
    *G11C 13/00*     (2006.01)
    *H10N 70/20*     (2023.01)

(58) Field of Classification Search
    CPC ............ H01L 45/1233; H01L 45/1246; H01L 45/144; H01L 45/1683; G11C 13/0004; G11C 2213/71; G11C 2213/74; G11C 2213/76; H10B 63/82; H10B 63/84; H10B 63/24; H10B 63/80; H10N 70/231; H10N 70/066; H10N 70/826; H10N 70/828; H10N 70/8828

See application file for complete search history.

(56) References Cited

U.S. PATENT DOCUMENTS

| | | |
|---|---|---|
| 7,642,123 B2 | 1/2010 | Lung |
| 7,785,920 B2 | 8/2010 | Lung et al. |
| 7,893,418 B2 | 2/2011 | Lung |
| 8,071,970 B2 | 12/2011 | Lee |
| 8,163,593 B2 | 4/2012 | Raghuram et al. |
| 8,395,935 B2 | 3/2013 | Lung et al. |
| 8,916,414 B2 | 12/2014 | Cheng et al. |
| 9,537,093 B1 | 1/2017 | Lai et al. |
| 9,659,998 B1 | 5/2017 | Lung |
| 9,741,764 B1 * | 8/2017 | Terai ................. H01L 27/11582 |
| 9,793,323 B1 | 10/2017 | Lung et al. |
| 10,937,832 B2 | 3/2021 | Lai et al. |
| 2007/0153569 A1 | 7/2007 | Nirschl et al. |
| 2007/0158633 A1 | 7/2007 | Lai et al. |
| 2010/0155687 A1 | 6/2010 | Reyes et al. |
| 2010/0163818 A1 | 7/2010 | Lee et al. |
| 2011/0147695 A1 | 6/2011 | Lee et al. |
| 2011/0186798 A1 * | 8/2011 | Kwon ................... H01L 45/124 257/E45.002 |
| 2011/0254126 A1 | 10/2011 | Kreupl et al. |
| 2012/0068136 A1 | 3/2012 | Park et al. |
| 2013/0279249 A1 | 10/2013 | Yun et al. |
| 2014/0246646 A1 | 9/2014 | Sasago et al. |
| 2015/0084156 A1 | 3/2015 | Ravasio et al. |
| 2015/0243884 A1 | 8/2015 | BrightSky et al. |
| 2017/0200768 A1 * | 7/2017 | Park ........................ H10N 70/20 |
| 2017/0250222 A1 * | 8/2017 | Wu ...................... H01L 45/1253 |
| 2017/0250339 A1 * | 8/2017 | Sim ..................... H01L 27/2427 |
| 2017/0288138 A1 | 10/2017 | Lee et al. |
| 2018/0033826 A1 | 2/2018 | Choi et al. |
| 2019/0393268 A1 | 12/2019 | Lai et al. |
| 2020/0194667 A1 | 6/2020 | Park et al. |
| 2020/0274060 A1 | 8/2020 | Campbell et al. |
| 2022/0020817 A1 | 1/2022 | Yang et al. |
| 2022/0173031 A1 | 6/2022 | Ryan |

FOREIGN PATENT DOCUMENTS

| | | |
|---|---|---|
| TW | 201203640 A | 1/2012 |
| TW | 201801300 A | 1/2018 |
| TW | 201803168 A | 1/2018 |

OTHER PUBLICATIONS

Fletcher, "Experimental Techniques for Thermal Contact Resistance Measurements," Department of Mechanical Engineering Texas A&M University, College Station, Texas 77843-3123, USA Available online Dec. 2, 2012, 12 pages.

Fong, et al., "Dual-Layer Dielectric Stack for Thermally Isolated Low-Energy Phase-Change Memory," IEEE Trans. on Electron Devices, vol. 64, No. 11, Nov. 2017, 7 pages.

Kau, et al., "A stackable cross point phase change memory," 2009 International Electron Devices Meeting, Baltimore MD, Dec. 7-9, 2009, pp. 27.1.1-27.1.4.

Kim et al. "ALD-based confined PCM with a metallic liner toward unlimited endurance," 2016 IEEE Int'l Electron Devices Meeting (IEDM), Dec. 3-7, 2016, 4 pages.

Kim, et al. "A phase change memory cell with metallic surfactant layer as a resistance drift stabilizer," Dec. 9-11, 2013, pp. 30.7.1-30.7.4.

Li et al., "Evaluation of SiO2 Antifuse in a 3D-OTP Memory," IEEE Transaction on Device and Materials Reliability, vol. 4, No. 3, Sep. 2004, 6 pages.

Malventano, "Breaking: Intel and Micron Announce 3D XPoint Technology—1000x Faster Than NAND" Jul. 28, 2015, 4 pages, found at https://www.pcper.com/news/Storage/Breaking-Intel-and-Micron-announce-3D-XPoint-Technology-1000x-Faster-NAND. cited byapplicant.

Sasago, et al., "Cross-point phase change memory with 4F2 cell size driven by low-contact-resistivity poly-Si diode," 2009 Symp. on VLSI Technology, Jun. 16-18, 2009, 2 pages.

Serra et al., "Outstanding Improvement in 4Kb Phase-Change Memory of Programming and Retention Performances by Enhanced Thermal Confinement," IEEE 11th Int'l Memory Workshop (IMW), May 12-15, 2019, pp. 1-4.

TW Office Action from Application No. 107132128, dated Jun. 13, 2019, 4 pages (plus English translation).

U.S. Office Action from related file U.S. Appl. No. 16/009,901 dated Aug. 14, 2019, 14 pages.

Vatto, et al, "Analyzing Intel-Micron 3D XPoint: The Next Generation Non-Volatile Memory," Jul. 31, 2015, 16 pages, found at https://www.anandtech.com/show/9470/intel-and-micron-announce-3d-xpoint-n-onvolatile-memory-technology-1000x-higher-performance-endurance-than-nand.

U.S. Office Action from U.S. Appl. No. 17/349,359 dated Dec. 15, 2022, 10 pages.

* cited by examiner

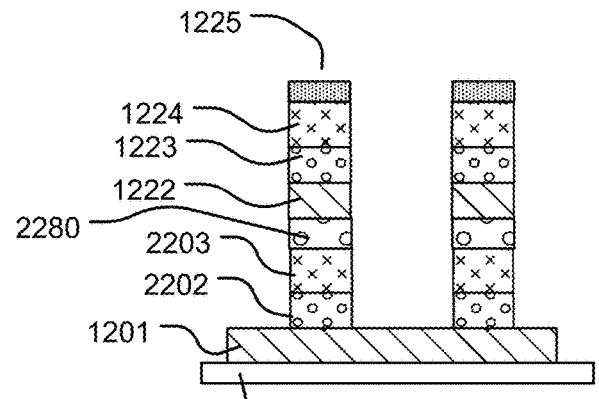
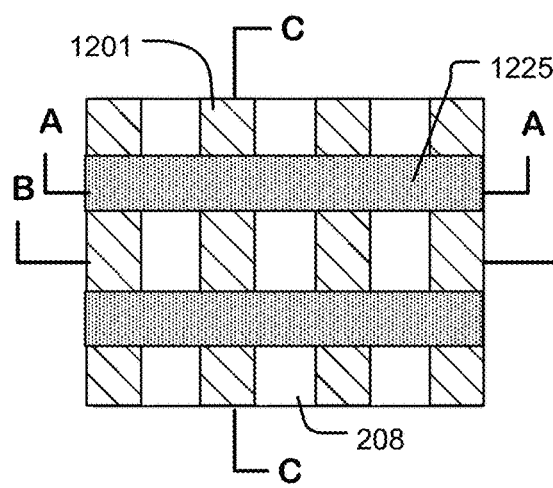
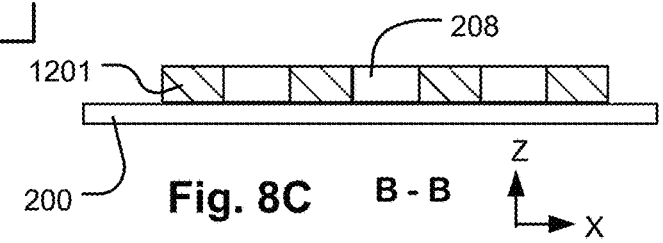
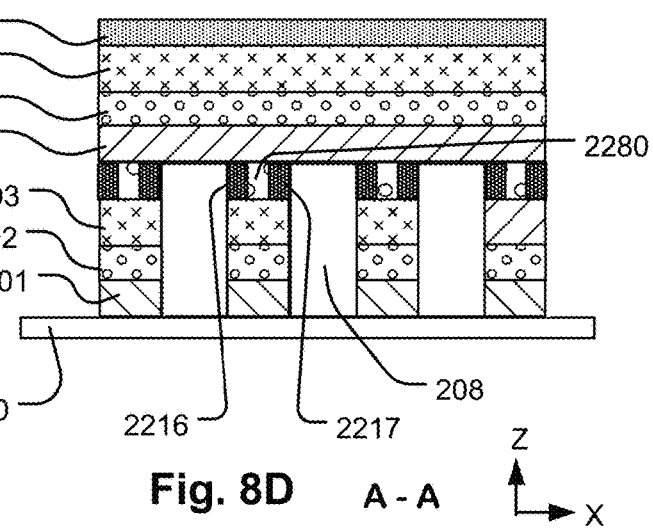

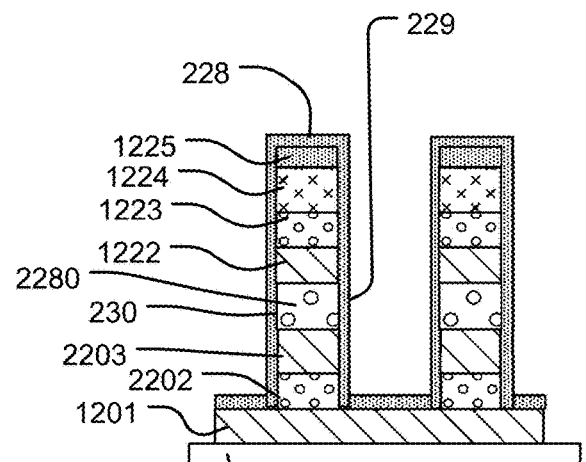
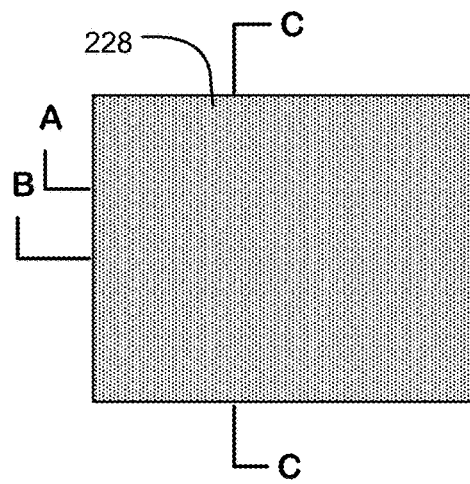
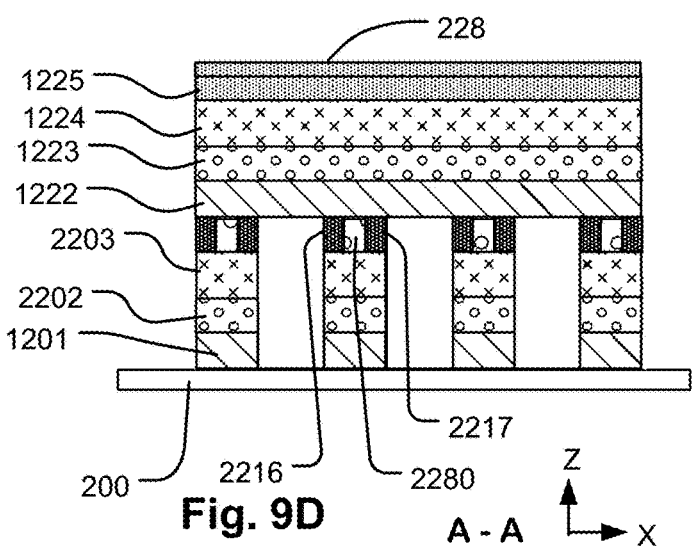

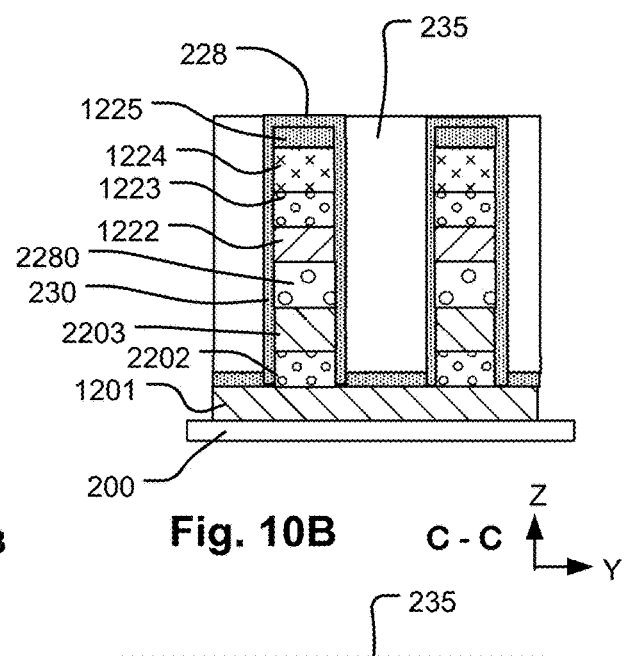
Fig. 10B
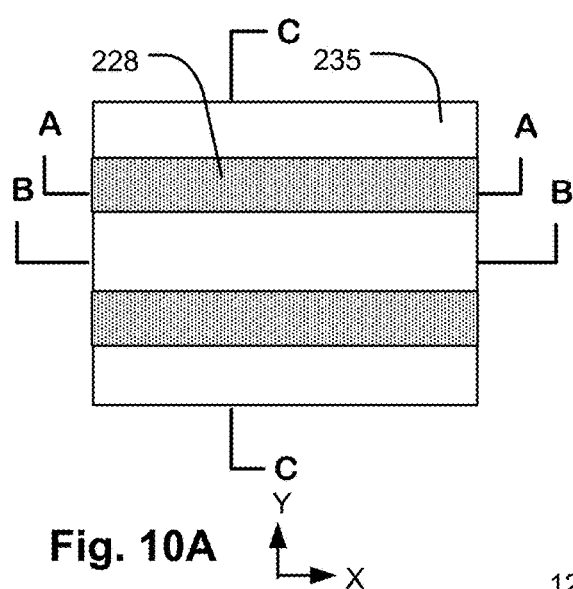
Fig. 10A
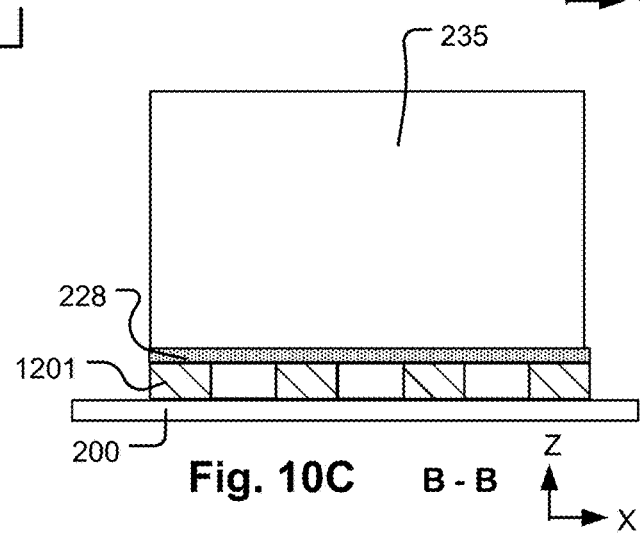
Fig. 10C
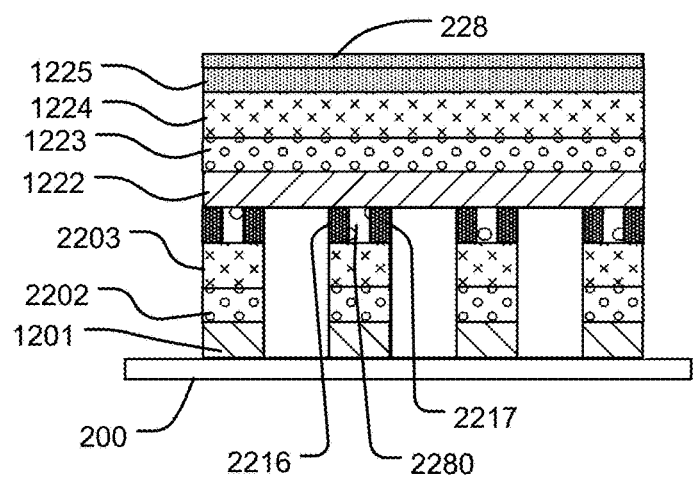
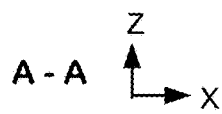
Fig. 10D

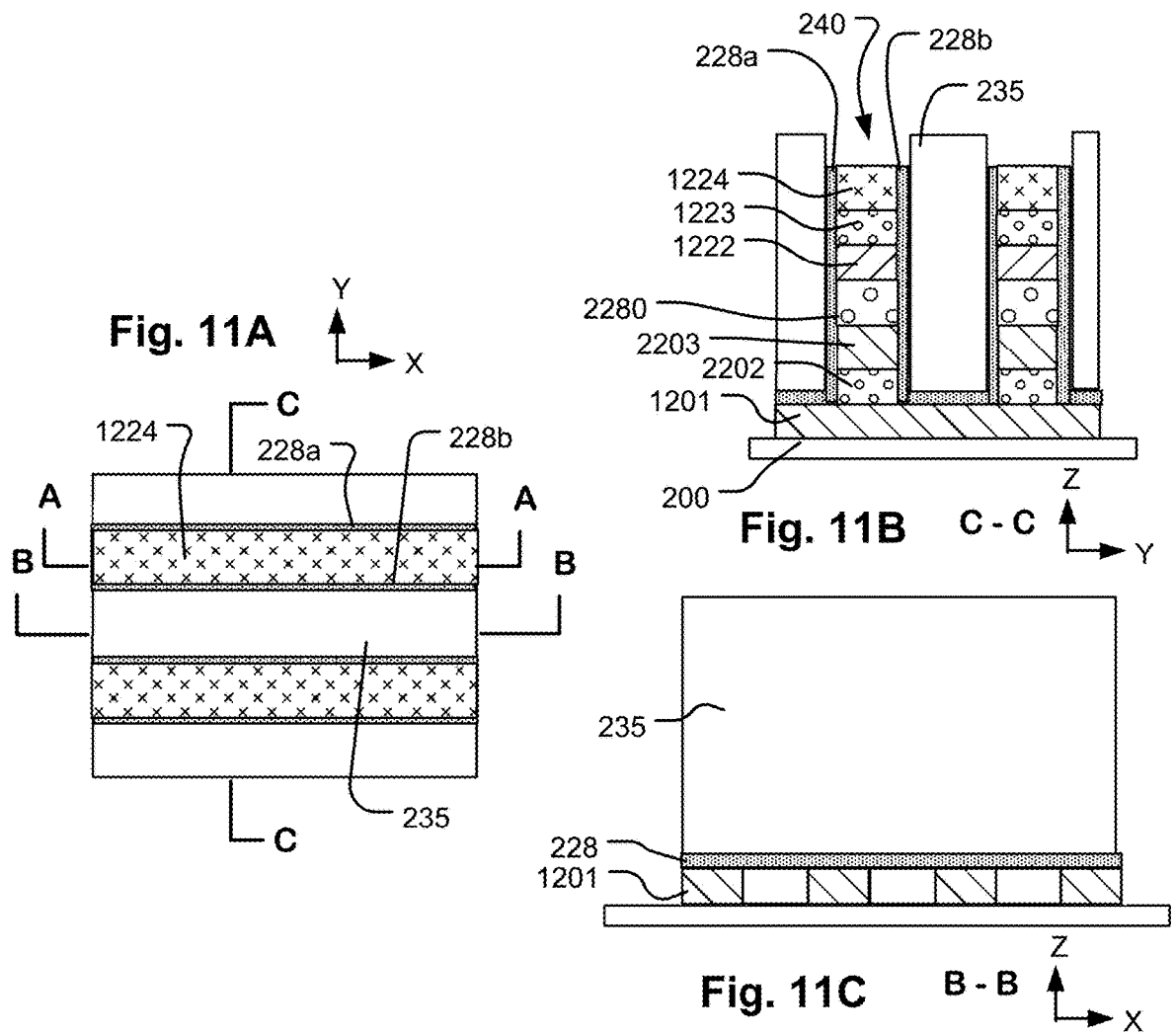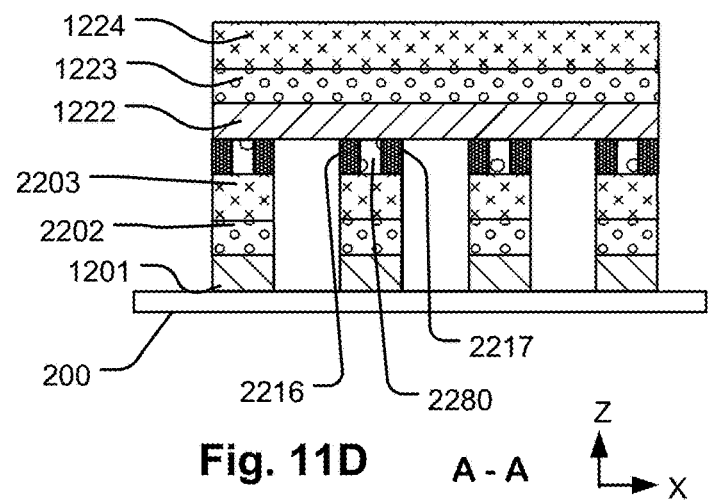

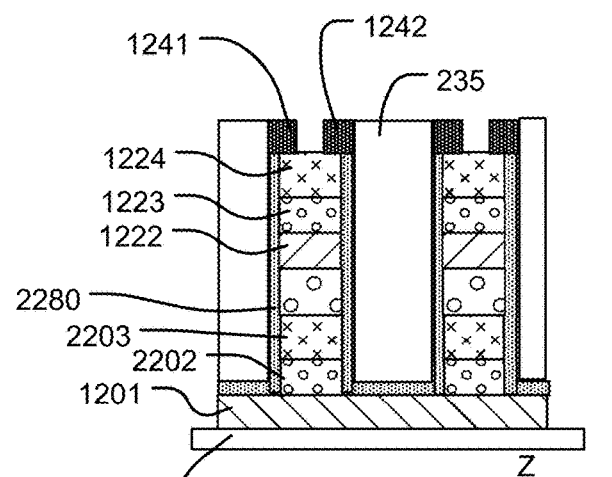
Fig. 12B
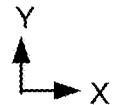
Fig. 12A
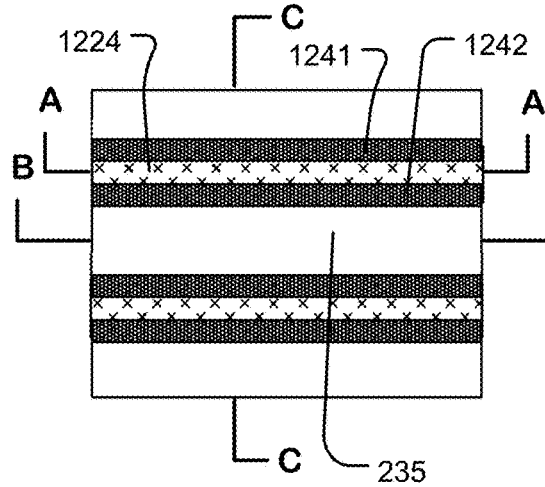
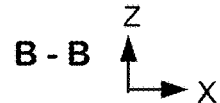
Fig. 12C
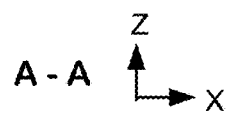
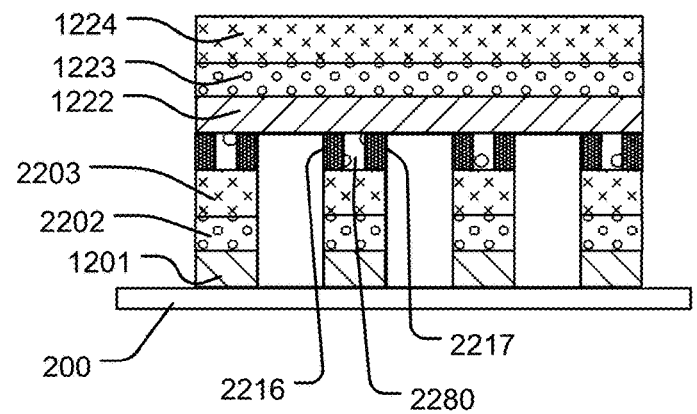
Fig. 12D

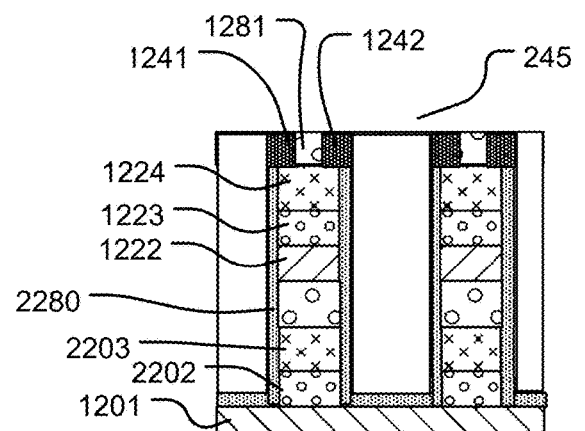
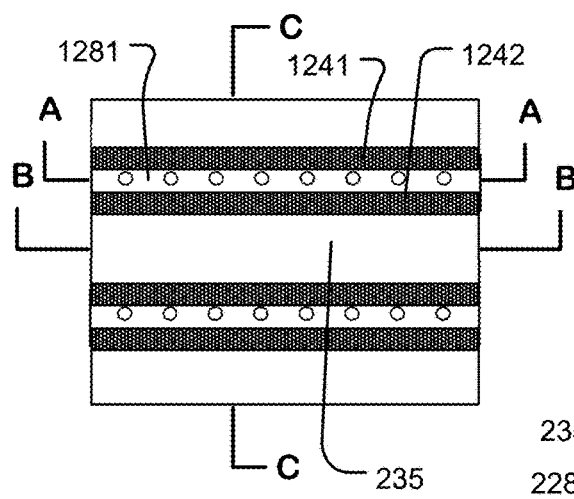
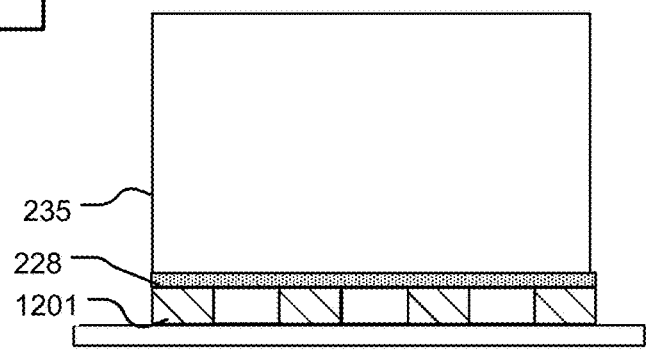
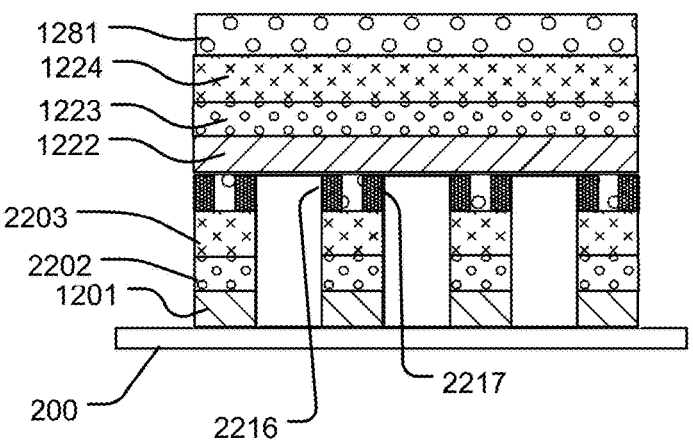

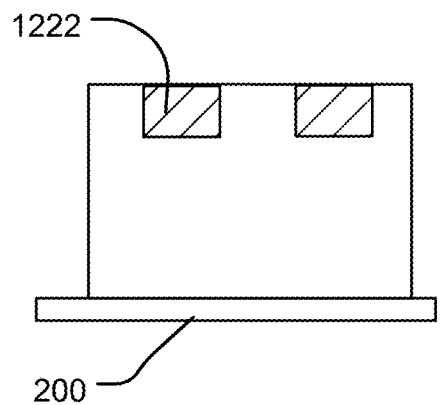
Fig. 14D D-D
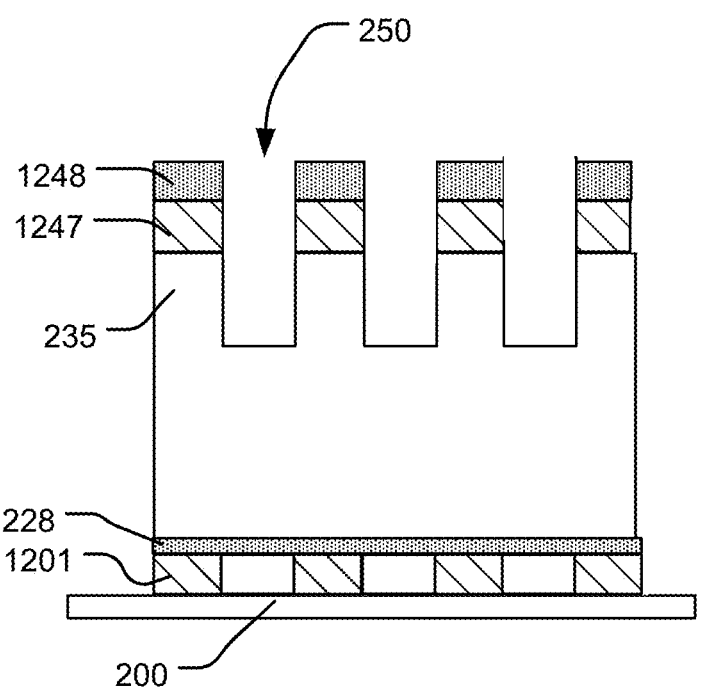
Fig. 14E B-B

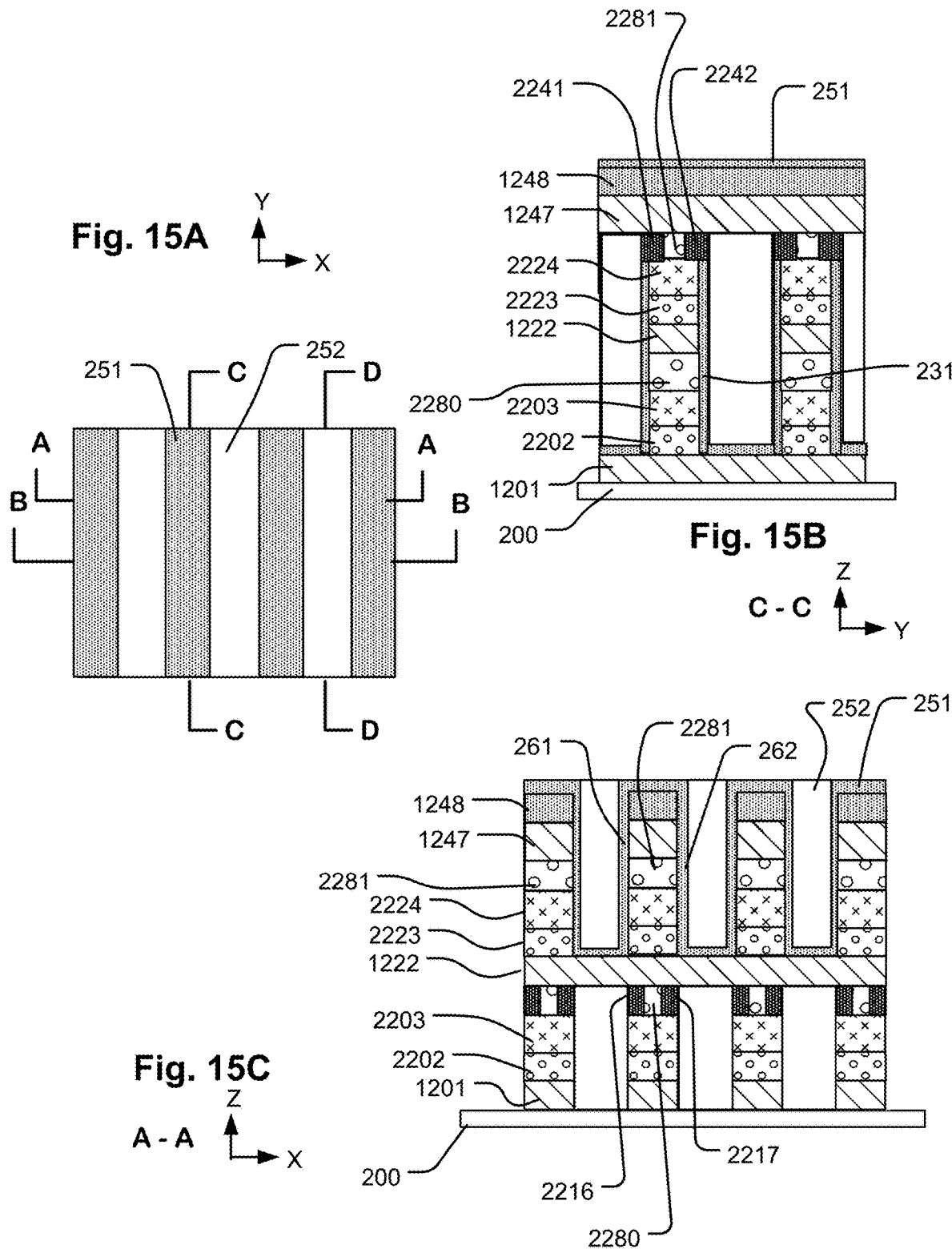

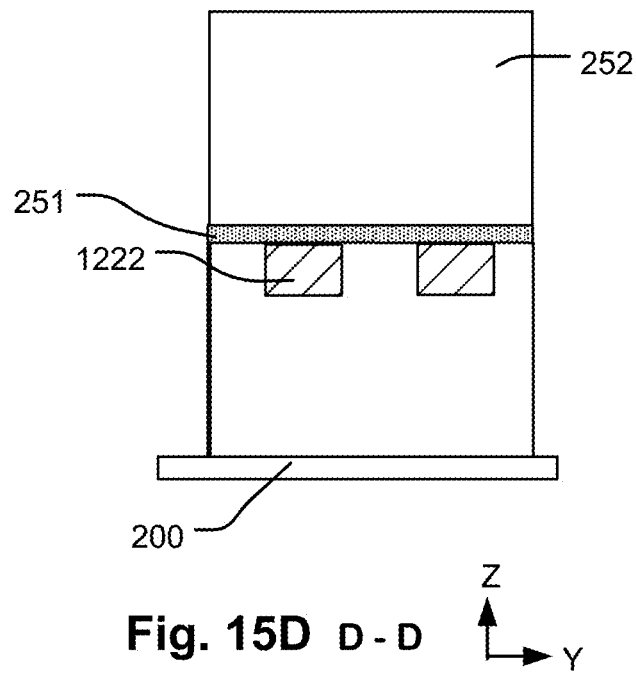
Fig. 15D D-D
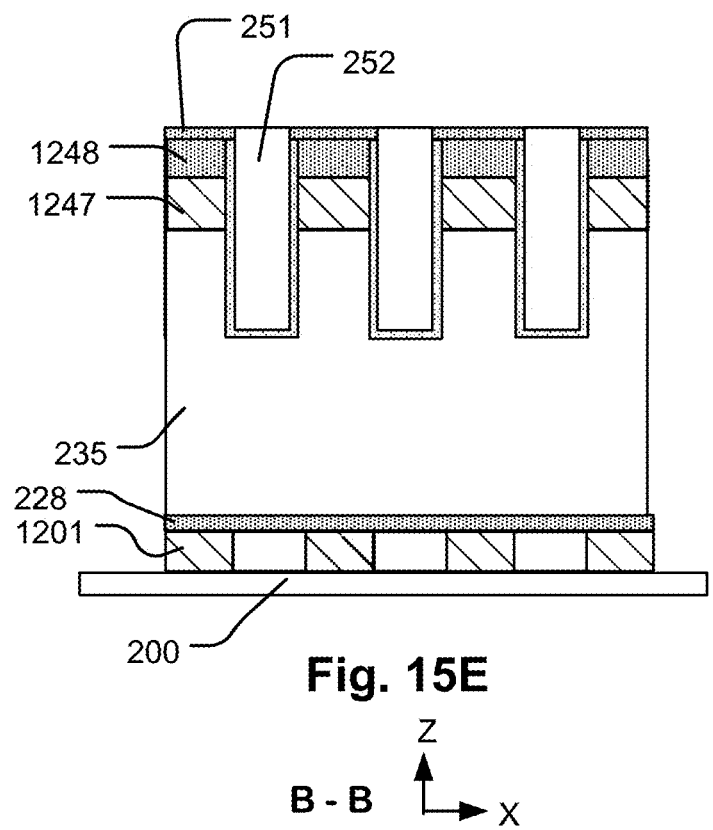
Fig. 15E B-B

3D MEMORY WITH CONFINED CELL

PRIORITY APPLICATION

This application is a divisional of U.S. application Ser. No. 16/014,346, filed 21 Jun. 2018 (now U.S. Pat. No. 10,937,832), entitled 3D Memory With Confined Cell. This application is incorporated herein.

BACKGROUND

Parties to a Joint Research Agreement

International Business Machines Corporation, a New York corporation, and Macronix International Corporation, Ltd., a Taiwan corporation, are parties to a Joint Research Agreement.

Technical Field

The technology described herein relates to integrated circuit memory technologies, including technologies using programmable resistance memory materials, including phase change materials, in 3D cross-point architectures, and methods for manufacturing such devices.

Description of Related Art

Many three dimensional (3D) memory technologies using phase change material, and other programmable resistance materials have been proposed in order to improve data storage density and reduce costs. For example, Li et al., "Evaluation of $SiO_2$ Antifuse in a 3D-OTP Memory," IEEE Transactions on Device and Materials Reliability, Vol. 4, No. 3, September 2004, describes a polysilicon diode and an anti-fuse arranged as a memory cell. Sasago et al., "Cross-Point Phase Change Memory with $4F^2$ Cell Size Driven by Low-Contact-Resistivity Poly-Si Diode," 2009 Symposium on VLSI Technology Digest of Technical Papers, pages 24-25, describes a polysilicon diode and a phase change element arranged as a memory cell. Kau et al., "A Stackable Cross Point Phase Change Memory," IEDM09-617, (2009) pages 27.1.1 to 27.1.4, describes a memory post including an ovonic threshold switch OTS as an access device with a phase change element. See also, Lung, U.S. Pat. No. 6,579,760 entitled SELF-ALIGNED, PROGRAMMABLE PHASE CHANGE MEMORY, issued Jun. 17, 2003.

Data retention and endurance limitations can limit the success of some technologies, particularly in high density configurations.

Another approach to improving data storage density for programmable resistance memory involves providing structures capable of reliably storing more than one bit per cell, so called multi-level cells. See for example, Kim et al., "A Phase Change Memory Cell with Metallic Surfactant Layer as a Resistance Drift Stabilizer," IEDM13-762, September, 2013.

It is desirable to provide a memory structure that is more readily manufacturable for high density structures, can be suitable for multi-level cell embodiments, and can satisfy data retention and endurance requirements.

SUMMARY

In embodiments described herein, memory cell stacks in a cross-point architecture have dimensions defined by the cross-point area of the word lines and bit lines, and include a switch, or steering device, such as an ovonic threshold switch, in series with a confined cell structure comprising a body of programmable resistance material, such as phase change material, and surfactant spacers electrically in parallel.

One aspect of the technology includes a cross-point memory, having a plurality of first conductors in a first patterned layer and a plurality of second conductors in a second patterned layer; and an array of memory cell stacks disposed between the first conductors and the second conductors. Each memory cell stack in the array comprises a switch in electrical series with a confined cell structure comprising a body of programmable resistance material, such as phase change material, and surfactant spacers electrically in parallel. The memory cell stack comprises a switch element, a conductive barrier layer, and a confined cell structure in series, and having sides aligned within the cross-point area of the corresponding cross-point, the confined cell structure including surfactant spacers within the cross-point area having outside surfaces on a pair of opposing sides of the stack, and a body of programmable resistance memory material confined between inside surfaces of the spacers.

In some embodiments the spacers have an upper surface, and the body of programmable resistance memory material contacts the second conductor at the corresponding cross-point at a level coplanar with the upper surface of the spacers, forming a pillar in the confined cell structure.

Also described is a 3D memory device such as an integrated circuit or multichip module, comprising a memory structure, including layers of first conductors extending in a first direction, alternating with layers of second conductors extending in a second direction, and a plurality of arrays of memory cells disposed in a plurality of levels. The memory cells in each level in the plurality of levels are disposed in cross-points between first conductors and second conductors. Each memory cell in a corresponding cross-point in the array comprises a memory cell stack including a switch and a body of programmable resistance memory material in electrical series. In this device, peripheral circuitry is coupled to the memory structure including logic to program and read multiple bits per memory cell in at least parts of the arrays of memory cells. Also, the memory cell stack can comprise a confined cell structure as describe above.

Another aspect of the technology is a method of manufacturing an integrated circuit including a memory like that described above.

Other features, aspects and advantages of the technology described herein can be understood with reference to the figures, the detailed description and the claims set out below.

BRIEF DESCRIPTION OF THE DRAWINGS

FIGS. 8A-8D are X-Y layout, Y-Z cross-section, and first and second X-Z cross-section views of a next stage in the example manufacturing process.

FIGS. 9A-9D are X-Y layout, Y-Z cross-section, and first and second X-Z cross-section views of a next stage in the example manufacturing process.

FIGS. 10A-10D are X-Y layout, Y-Z cross-section, and first and second X-Z cross-section views of a next stage in the example manufacturing process.

FIGS. 11A-11D are X-Y layout, Y-Z cross-section, and first and second X-Z cross-section views of a next stage in the example manufacturing process.

FIGS. 12A-12D are X-Y layout, Y-Z cross-section, and first and second X-Z cross-section views of a next stage in the example manufacturing process.

FIGS. 13A-13D are X-Y layout, Y-Z cross-section, and first and second X-Z cross-section views of a next stage in the example manufacturing process.

FIGS. 14A-14E are X-Y layout, Y-Z cross-section, first Y-Z cross-section, first X-Z cross-section, second Y-Z cross-section and second X-Z cross-section views of the sub-assembly at a next stage in the example manufacturing process.

FIGS. 15A-15E are X-Y layout, first Y-Z cross-section, first X-Z cross-section, second Y-Z cross-section and second X-Z cross-section views of the sub-assembly at a next stage in the example manufacturing process.

DETAILED DESCRIPTION

Detailed descriptions of embodiments of programmable resistance memory devices and of methods of manufacturing such devices are provided with reference to FIGS. 1-16.

Figure 1:
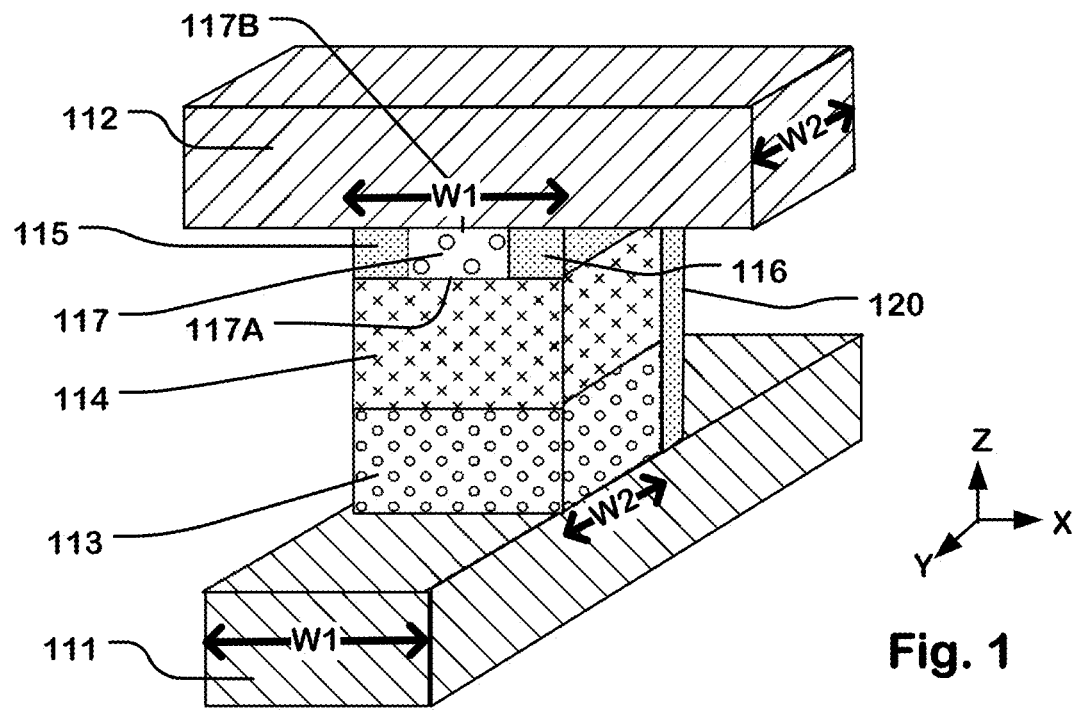
FIG. 1 is a perspective view of an embodiment of a memory cell having a confined memory element in a cross-point array.

FIG. 1 is a perspective view of a phase change memory cell suitable for use in a cross-point array. A first conductor 111 can be configured as a bit line for connection to sense amplifiers, and a second conductor 112 can be configured as a word line for connection to decoded voltage drivers. A memory cell stack is disposed between first conductor 111 and second conductor 112 and comprises a switch in series with a body 117 of phase change material. The switch comprises an ovonic threshold switching layer 113 and a diffusion barrier 114. The stack has a first end (top end in the illustration) including the body 117 of phase change material in contact for current flow connection with the second conductor 112, and a second end (bottom end in the illustration) including the switching layer 113 in contact for current flow connection with first conductor 111. The body of phase change material is confined between surfactant spacers 115, 116, which provide a parallel current path having a stable resistance.

In another example, the switch and phase change material are inverted, so that the phase change material is in contact with first conductor 111 and the switching layer 113 is in contact with second conductor 112.

The memory cell stack includes a switch element that comprises the ovonic threshold switch material in layer 113, a conductive barrier layer that comprises the barrier material in layer 114, and a memory cell in series.

The memory cell includes surfactant spacers 115, 116 having inside and outside surfaces. The surfactant spacers 115, 116 have outside surfaces aligned within the cross-point area on a first pair of opposing sides of the memory cell stack (left and right sides in the illustration), and inside surfaces in contact with a body of programmable resistance material confined between inside surfaces of the spacers.

The surfactant spacer (e. g. 115 or 116) preferably has a lower resistivity than the highest resistance phase of the programmable resistance material, which is the reset amorphous phase of phase change material; but higher resistivity than a lower resistance phase or phases of the programmable resistance material, which is or includes the set crystalline phase of phase change material. The body of programmable resistance material makes ohmic contact with the surfactant spacer surface so that it acts as a bypass resistor between lower resistively phase portions of the material and the conductive barrier layer 114, or between the lower resistivity phase portions of the material and the second conductor 112. This bypass resistor has a varying resistance that varies as a function of the length of the bypass, and the relative resistances of the surfactant spacer and the bypassed parts of the programmable resistance material.

This way, the resistance of the cell changes with the sizes of the higher resistance and lower resistance phases, because the higher resistance phase is bypassed in the areas of contact between them. The actual resistivity of the amorphous phase, which may drift, is not as critical in controlling the cell resistance because of the bypass through the spacer. This can result in the more stable resistivity of the spacer improving the uniformity over time of the actual resistance of the cell.

The surfactant spacers 115 and 116 with the body 117 of phase change material provide a confined element of programmable resistance material with an area of contact 117A with the barrier layer 114 that is substantially less than the cross-point area of the memory cell stack at the corresponding cross-point. In this embodiment, the surfactant spacers 115, 116 comprise metal nitride, such as titanium nitride or tantalum nitride. Other conductive materials having sufficient resistivity to provide surfactant spacer function as discussed above. Some materials that can have sufficient resistivity for use as surfactant spacers include tungsten nitride (WN), molybdenum nitride (MoN), titanium silicon nitride (TiSiN), titanium aluminum nitride (TiAlN). In addition to metal nitrides, conductive materials, such as titanium carbide (TiC), tungsten carbide (WC), graphite (C), other carbon (C) forms, titanium silicide (TiSix,), cobalt silicide CoSix, nickel silicide NiSix, tantalum silicide (TaSix), platinum silicide PtSix, tungsten silicide WSix, and titanium tungsten (TiW).

In alternative embodiments, an additional surfactant spacer or pair of surfactant spacers can be included on the forward and backward sides as well, further reducing the volume of the confined body of phase change material aligned within the memory cell stack.

The phase change material can comprise chalcogenide-based materials, for example $Ga_xSb_yTe_z$, $Ge_xSb_yTe_z$, $Ga_wGe_xSb_yTe_z$, $Ge_wGe_xSb_yTe_z$, $Ag_wIn_xSb_yTe_z$, $Sn_wGe_xSb_yTe_z$, $Se_wGe_xSb_yTe_z$ and $S_wGe_xSb_yTe_z$. The phase change material comprises a first element, for example tellurium (Te), and the second element, for example antimony (Sb). The phase change material can have additives, for example nitrogen, silicon, oxygen, silicon oxide, and silicon nitride. In one embodiment, the phase change material is $Ge_xSb_yTe_z$, with a silicon oxide additive, the first element is Te and the second element is Sb.

Switching layer 113 can comprise a chalcogenide combination selected for operation as an ovonic threshold switch, and can include one or more elements selected from the group comprising arsenic (As), tellurium (Te), antimony (Sb), selenium (Se), germanium (Ge), silicon (Si), oxygen (O) and nitrogen (N). In one example, switching layer 113 can have a thickness of about 10 nm to about 40 nm, preferably about 30 nm. Czubatyj et al., "Thin-Film Ovonic Threshold Switch: Its Operation and Application in Modern Integrated Circuits," Electronic Materials Letters, Vol. 8, No. 2 (2012), pages 157-167, describes applications and electrical characteristics of the thin-film Ovonic Threshold Switch (OTS). In other embodiments, other current steering devices can be utilized, including diodes, transistors, tunneling dielectric layers, and so on.

Diffusion barrier layer 114 comprises a material or combination of materials selected to provide adequate adhesion between switching layer 113 and the phase change material, and blocks movement of impurities from the pillar into the switch and vice versa. The diffusion barrier layer 114 can be comprised of conductive material with a thickness of about 3 to about 30 nm, preferably about 5 nm, forming a conductive barrier layer. Appropriate materials for the diffusion barrier layer 114 may comprise a metal nitride, for example, titanium nitride (TiN), tantalum nitride (TaN), tungsten nitride (WN), molybdenum nitride (MoN), titanium silicon nitride (TiSiN), titanium aluminum nitride (TiAlN). In addition to metal nitrides, conductive materials, such as titanium carbide (TiC), tungsten carbide (WC), graphite (C), titanium (Ti), molybdenum (Mo), tantalum (Ta), titanium silicide (TiSi), platinum silicide (PtSi) tantalum silicide (TaSi), and titanium tungsten (TiW), can be used for diffusion barrier layer 114.

The materials chosen for first conductor 111 and second conductor 112 can comprise a variety of metals, metal-like materials and doped semiconductors, and combinations thereof. First conductor 111 and second conductor 112 can be implemented using one or more layers of materials like tungsten (W), aluminum (Al), copper (Cu), titanium nitride (TiN), tantalum nitride (TaN), tungsten nitride (WN), doped polysilicon, cobalt silicide (CoSi), Tungsten silicide (WSi) and other materials. In one example, the conductors 111 and 112 comprise a tri-layer structure including TIN, W and TiN.

In the embodiment of FIG. 1, the first conductor 111 has a width W1 that is defined by a patterning technology, such as photolithography so that it is as small as practical given the manufacturing technologies and operational characteristics. Likewise, the second conductor 112 has a width W2 that is defined by a patterning technology so that it is as small as practical. At the cross-point of the first conductor 111 and the second conductor 112, a cross-point area is defined. A memory cell stack is disposed within a cylindrical region at the cross-point between the first and second conductors 111, 112, the cross-section of which is defined by the cross-point area (W1×W2) and the etching processes aligned by the sides of the first and second conductors. The memory cell stack can be self-aligned with the first and second conductors in that no additional alignment technique is applied other than the etching and patterning techniques used to form the first conductor 111 and the second conductor 112.

Also, in this embodiment, the memory cell includes confinement liners on a second pair of opposing sides of the memory cell stack (forward and backward sides in the illustration). The confinement liners comprise layers of confinement material—only the backside confinement liner that comprises a layer of confinement material 120 is illustrated, as the front side confinement liner is removed for the purposes of revealing the underlying structure. The confinement liners (e.g. layer of confinement material 120) having inside surfaces in contact with the body of programmable resistance material in this embodiment, and outside surfaces facing fill material in the trenches between the cross-points. The body of programmable resistance material is thus confined both by the surfactant spacers 115, 116, and the confinement liners (e.g. layer of confinement material 120) aligned with the cross-point area of the memory cell stack.

In this embodiment, the stack includes a confined cell structure including surfactant spacers within the cross-point area having outside surfaces on a pair of opposing sides of the stack, and a body 117 of programmable resistance memory material confined between inside surfaces of the surfactant spacers 115, 116. The body 117 of programmable resistance memory material comprises a pillar of material that makes contact 117B with the second conductor at a level coplanar with the top of the spacers 115, 116, with a contact area that can be similar to the area of contact 117A. As a result, the memory element in the memory cell stack forms a "pillar" style memory element. In the pillar structure, the volume of the active region can be almost the same as the volume of the phase change material.

Figure 1A:
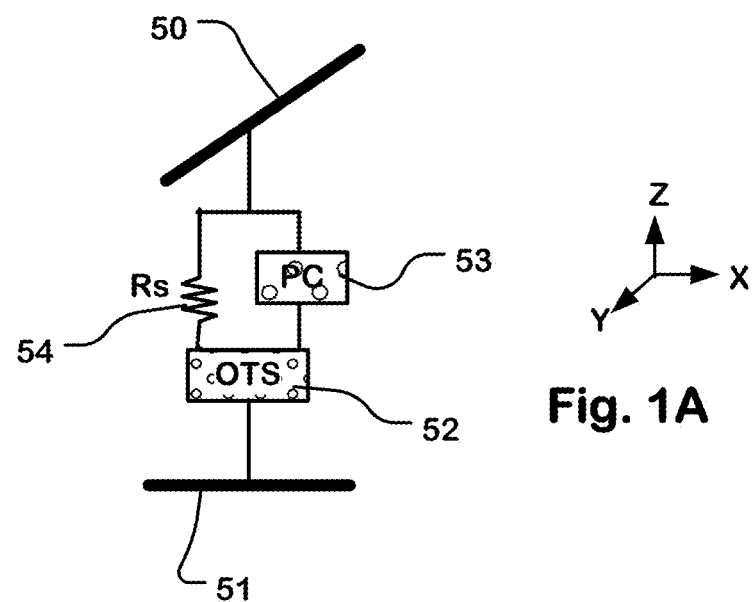
FIG. 1A is as circuit schematic diagram of a memory cell stack as shown in FIG. 1.

FIG. 1A is an electrical schematic diagram of a memory cell stack like that shown in FIG. 1. The memory cell stack is disposed at a cross-point between a first conductor 50 and a second conductor 51. The memory cell stack includes a switch 52, such as an ovonic threshold switch, and a body 53 of programmable resistance material, such as phase change material, in electrical series between the first conductor 50 and the second conductor 51. A resistor 54, implemented in the structure of FIG. 1 by the surfactant spacers 115, 116 and having the resistance Rs, determined by the geometry and material of the surfactant spacers, is disposed in parallel with the body 53 of programmable resistance material between the switch 52 and the first conductor 50 in this embodiment. In another embodiment, the stack can be reversed so that the body 53 of programmable resistance material and the resistor 54 are disposed in parallel between the switch 52 and the second conductor 51. As noted in FIG. 1, there may be a barrier layer between the switch 52 and the body 53 of programmable resistance material and the resistor 54. Also, there may be other active or passive layers of materials in the memory cell stack.

The resistance Rs of the surfactant spacers can have a value which is substantially greater than the resistance of the body 53 of programmable resistance material in its low resistance state. Also, the body 53 of programmable resistance material can be programmed and read in multiple levels establishing multiple bits per cell. The multiple levels include a highest resistance level, typically referred to as the reset state, and a plurality of lower resistance levels. The resistance Rs in the multiple level embodiment can be lower than the resistance of the highest resistance level of the cell. The parallel resistor 54 can serve to stabilize the operation of the memory cell in the multilevel embodiment.

Figure 2:
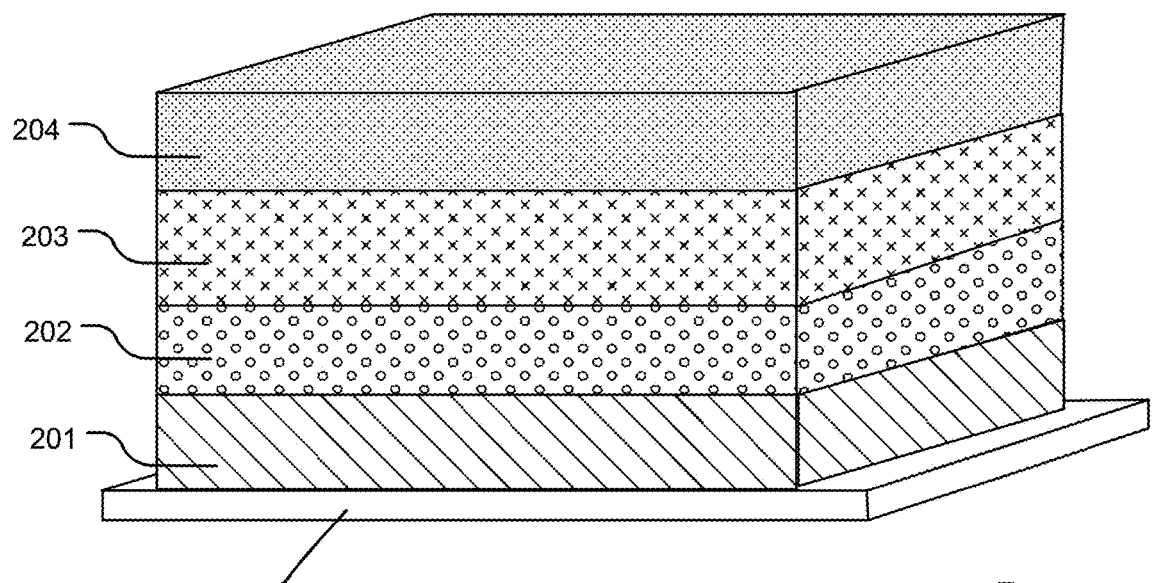
FIGS. 2-4 are 3D perspective views illustrating stages of an example of a manufacturing process for a 3D cross-point memory.
Figure 3:
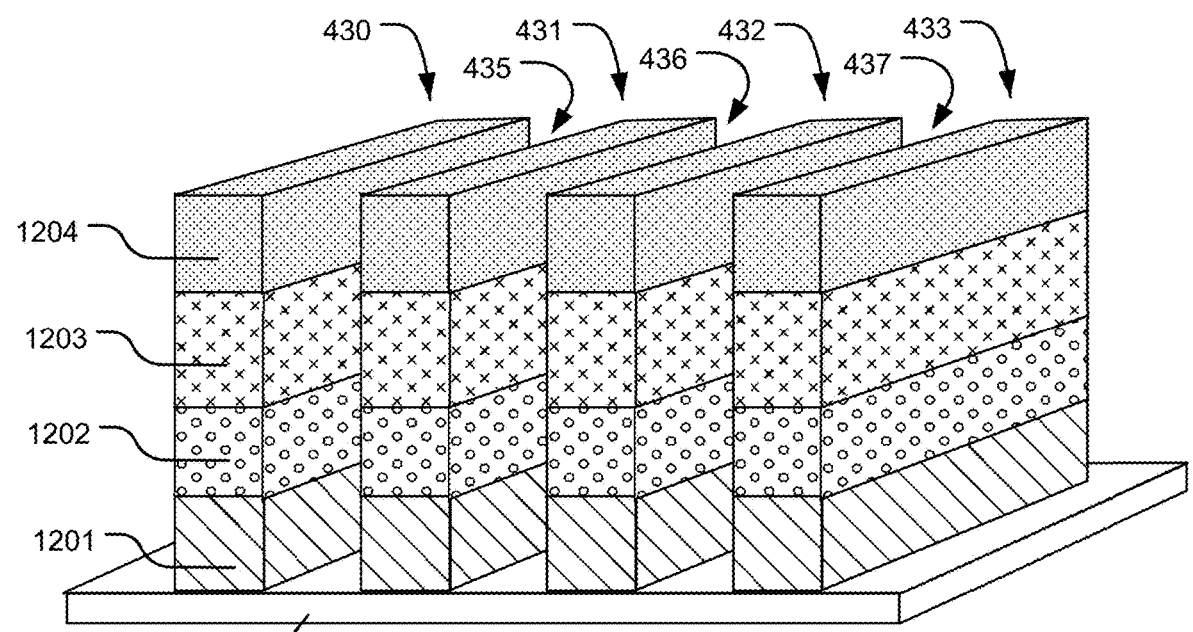
Figure 4:
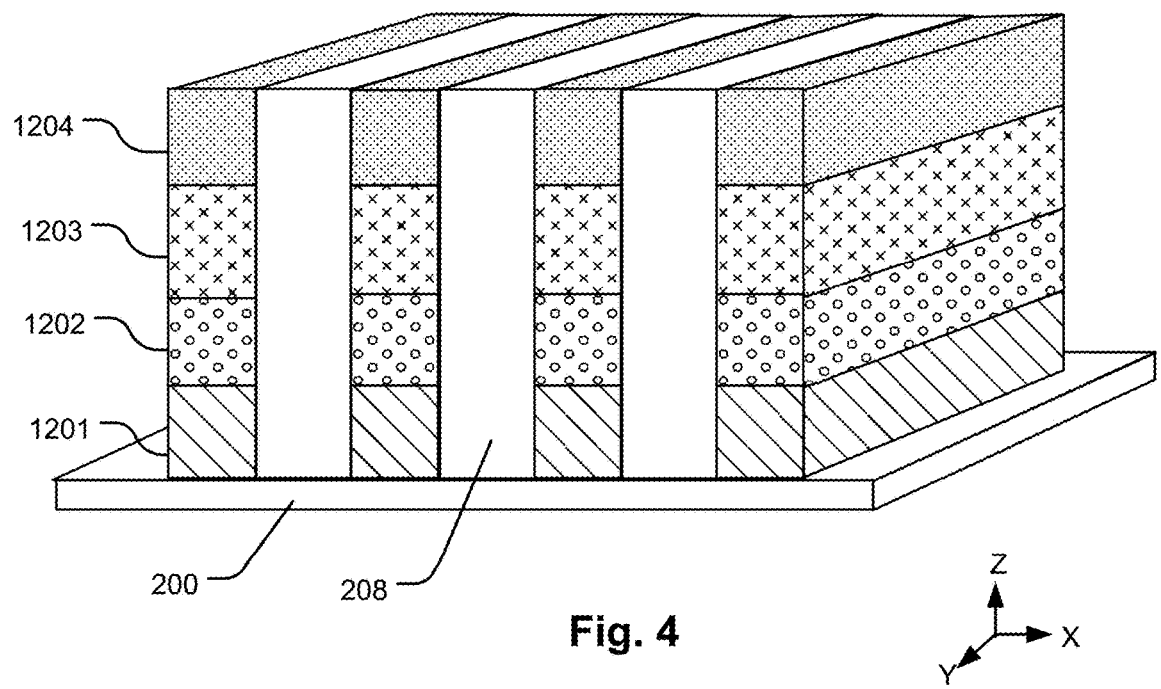

FIGS. 2 through 15E are a sequence of figures illustrating stages of an example process flow for manufacturing an array of memory cells like that of FIG. 1. FIGS. 2 through 4 are shown in 3D perspective view. Figures thereafter in the sequence include 2D layout and cross-section views that show the structure for simplicity. Reference numerals used in this set of figures are generally applied throughout.

FIG. 2 illustrates a stage in the manufacturing process after forming a first stack of materials 200-204. Base layer 200 provides an insulating substrate that can be formed of a buried oxide or silicon nitride layer on an integrated circuit substrate, or other type of insulating base. There can be circuitry underlying the base layer 200 in some embodiments. The process involves depositing materials of a first conductor layer 201, materials of a switch element in a switching layer 202, materials of a conductive barrier layer 203, and then a hard mask layer 204.

The materials of the first conductor layer 201 can comprise a multilayer combination of titanium nitride, tungsten and titanium nitride as mentioned above. Other combinations of materials can be utilized. These materials can be deposited using for example one or more of chemical vapor deposition CVD, physical vapor deposition PVD, and atomic layer deposition ALD processes.

The materials of the switching layer 202 can comprise materials for an ovonic threshold switch element, such as those described above. In embodiments in which the switching element layer 202 comprises phase change material, the layers can be deposited by physical vapor deposition (PVD), sputtering, or a magnetron-sputtering method with source gas(es) of Ar, $N_2$, and/or He, etc. at the pressure of 1 mTorr~100 mTorr, for example. Alternatively, the layers also can be formed using chemical vapor deposition (CVD) and atomic layer deposition (ALD). Additives can be included in the layers of phase change material by sputtering, or by other methods. Thus, the phase change material comprises a chalcogenide or a chalcogenide with one or more additives selected from a group including silicon, oxygen, nitrogen, carbon and dielectrics. Each of the layers of phase change material can have a thickness ranging from about 10 nm to 50 nm.

The materials of the conductive barrier layer 203 can comprise a variety of barrier materials selected in accordance with the programmable resistance memory element. For a phase change memory element, a suitable barrier material can be titanium nitride. Alternative embodiments can comprise carbon varieties, including carbon nanotubes and graphene. Also, material such as silicon carbide and other conductive barrier materials can be utilized.

Materials of the hard mask layer 204 can comprise silicon nitride, or other suitable hard mask material selected in accordance with the etch chemistry being applied.

FIG. 3 illustrates a stage in manufacturing after patterning the stack of materials to define a plurality of trenches 435, 436, 437 between stacked lines 430, 431, 432, 433 (extending in the Y-direction in the illustration). This first patterning step stops on the underlying base layer 200. Each of the stacked lines (e.g. 430), includes a first conductor 1201 in the patterned first conductor layer 201, a line 1202 of the materials of a switching element layer 202, a line 1203 of the conductive barrier material from the conductive barrier material layer 203, and a line 1204 of the hard mask material from the hard mask layer 204.

FIG. 4 illustrates a stage after forming an insulating fill (e.g. 208) in the trenches (435, 436, 437 of FIG. 4). The insulating fill can be formed by a deposition of silicon oxide, or other insulating fill materials suitable for the cross-point architecture. A low dielectric constant fill material can help reduce capacitance, enabling better operating speeds. The fill step can be implemented using a spin-on process, CVD, ALD, PVD, LPCVD, and HDPCVD, for example. After depositing the insulating fill, a chemical mechanical polishing CMP step can be applied that stops on the lines 1204 of hard mask material in the hard mask layer 204, providing a smooth, planar surface on which to build the following layers.

Figure 5A:
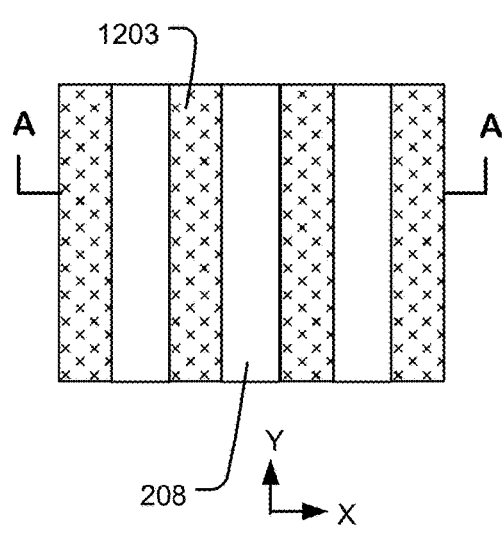
FIGS. 5A-5B are X-Y layout and X-Z cross-section views of a next stage in the example manufacturing process.
Figure 5B:
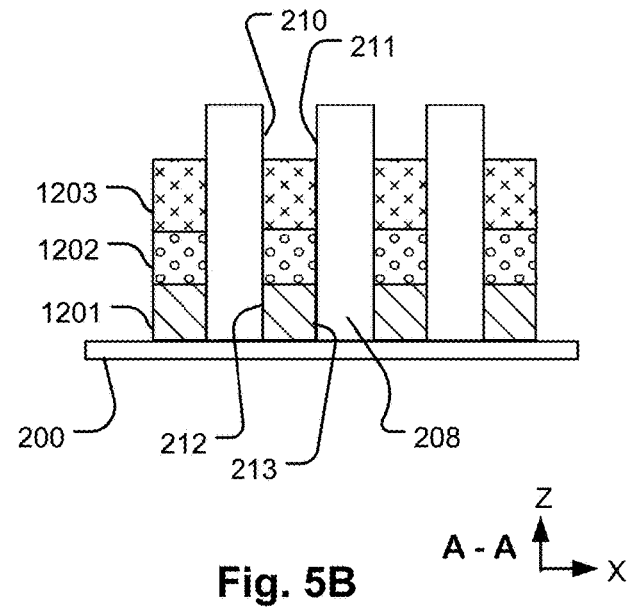

FIG. 5A is an aerial layout view of an X-Y plane, and FIG. 5B is a cross-section view of an X-Z plane along line A-A shown in FIG. 5A in a succeeding stage of the process. Referring to FIG. 5A, the aerial view reveals the lines 1203 of the conductive barrier material of layer 203 extending in the Y-direction, separated by lines of fill material 208. FIG. 5B shows a cross-section taken along the line A-A shown in FIG. 5A of the structure that results from an etch process to remove the lines 1204 of hard mask material. As a result, recesses are formed between the lines of insulating fill material 208 having sidewalls 210, 211 that are self-aligned (i.e. without additional alignment step) with the sides 212, 213 of the lines of the first conductor material of layer 201.

Figure 6A:
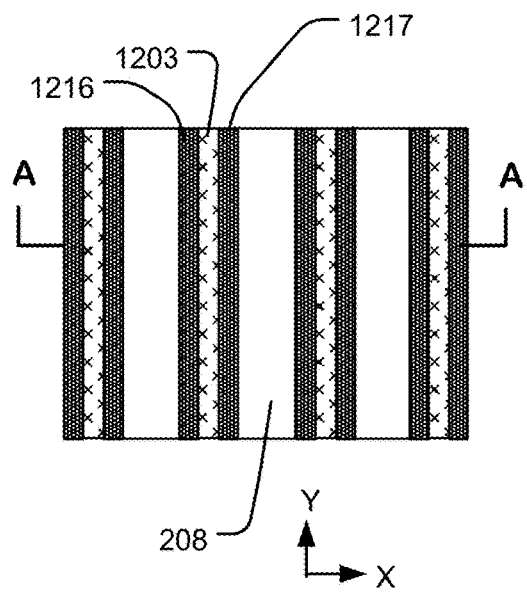
FIGS. 6A-6B are X-Y layout and X-Z cross-section views of a next stage in the example manufacturing process.
Figure 6B:
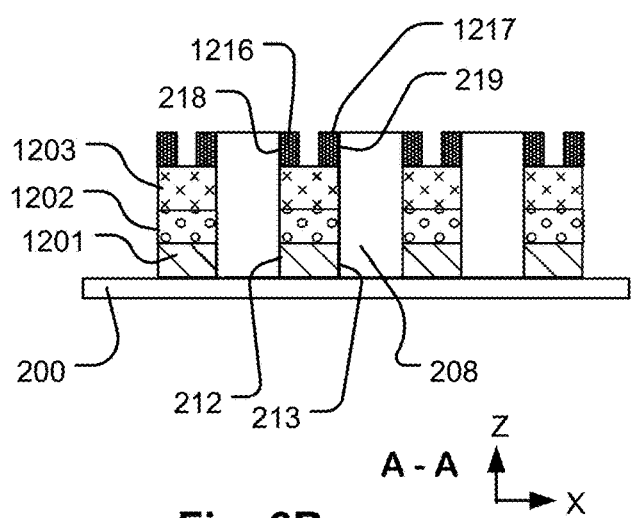

FIG. 6A is an aerial layout view of an X-Y plane, and FIG. 6B is a cross-section view of an X-Z plane along line A-A shown in FIG. 6A in a succeeding stage of the process. At this stage, spacer lines (e.g. 1216, 1217) are formed within the recesses by a blanket deposition of the surfactant spacer material (e.g. titanium nitride) followed by anisotropic etching using an etch chemistry selected for the surfactant spacer material over the fill material, to remove the material over the flat top of the fill material 208 and the flat bottoms of the recesses, while leaving sidewall spacers as illustrated. This results in formation of more narrow trenches. Referring to FIG. 6A, the aerial view reveals lines 1216, 1217 of sidewall surfactant spacer material with the underlying line 1203 of conductive barrier material exposed beneath the lines of sidewall spacer material. FIG. 6B shows a cross-section taken along the line A-A of FIG. 6A, of the structure that results from formation of the sidewall spacer lines 1216, 1217. The sidewall surfactant spacer lines 1216, 1217 are formed on the first pair of opposing sides of the lines, and have outside surfaces 218, 219 formed on the sides of the lines of fill material 208, and as a result are self-aligned with the recesses. Also, the sidewall surfactant spacer lines 1216, 1217 can have top surfaces that are coplanar within practical limitations of the etching techniques with the top surfaces of the lines of fill material 208.

Figure 7A:
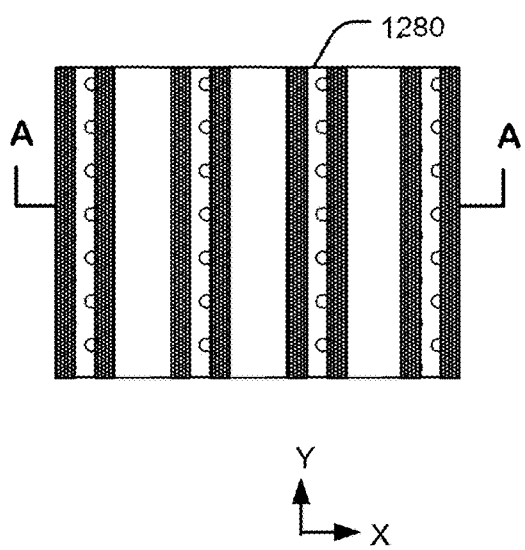
FIGS. 7A-7B are X-Y layout and X-Z cross-section views of a next stage in the example manufacturing process.
Figure 7B:
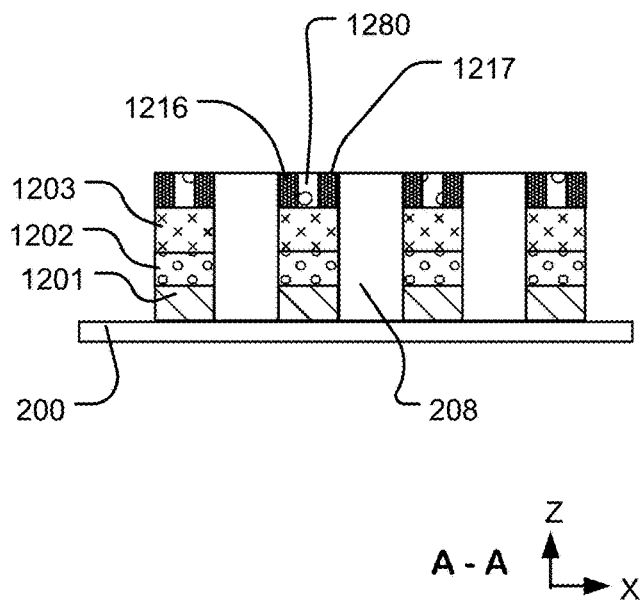

FIG. 7A is an aerial layout view of an X-Y plane, and FIG. 7B is a cross-section view of an X-Z plane along line A-A shown in FIG. 7A in a succeeding stage of the process. At this stage, a blanket layer of phase change material is deposited over the structure, and etched back to a level coplanar with upper surfaces of the spacer lines 1216, 1217. Referring to FIG. 7A, the aerial view shows the more narrow lines 1280 of phase change material confined between the spacers. In FIG. 7B, the cross-section view taken on the line A-A shows phase change material including a line 1280 of phase change material confined between the spacer lines 1216, 1217 along the lines between the fill 208. During the deposition of the blanket layer, the composition of the phase change material layer can be changed as suits the particular implementation, so that there may be variations in the concentrations of the various elements through the depth of the structure.

FIG. 8A is an aerial layout view of an X-Y plane; FIG. 8B is a cross-section view of a Y-Z plane along line C-C shown in FIG. 8A; FIG. 8C is a cross-section view of an X-Z plane along line B-B shown in FIG. 8A; and FIG. 8D is a cross-section view of an X-Z plane along line A-A shown in FIG. 8A, in a succeeding stage of the process. At this stage, the manufacturing process has included deposition of a second stack of materials (best seen with reference to FIG. 8D) including materials of the second conductor layer, materials of a switch element in a switching layer, materials of a conductive barrier layer, and materials of a hard mask layer. Materials deposited can be the same as those discussed above in connection with FIG. 2, or variations on those materials as suits a particular embodiment. Also, the manufacturing process has included patterning the stacks to define the plurality of trenches stopping at the level of the first conductor 1201, between stacked lines, including second conductors 1222, lines 1223 of switching layer, lines 1224 of conductive barrier layer, and lines 1225 of hard mask layer, best seen with reference to FIG. 8B. Referring to FIG. 8A, the aerial view reveals a plurality of first conductors 1201 extending in the Y-direction (at the bottom of the trenches), overlaid by a plurality of stacked lines having a line 1225 of hard mask material on the upper surface, extending in the X-direction.

FIG. 8B is a cross-section taken along the line C-C of FIG. 8A, revealing the structure of the X-direction stacked lines 1222, 1223, 1224, 1225 extending along the lines, and memory cell stacks self-aligned with the sides of the first conductors 1201 and second conductors 1222, as a result of the patterned etching. Memory cell stacks include elements 2202 and 2203 and the body of phase change material 2280 between spacers 2216, 2217 in the cylindrical volumes at cross-points of the first conductor line 1201 and the second conductive line 1222.

FIG. 8C is a cross-section taken along the line B-B of FIG. 8A between the stacked lines, showing that the trenches stop on the upper surface of the first conductors 1201. FIG. 8D shows that as a result of this depth of etching, memory cell stacks (2216, 2280, 2217, 2203, 2202) are formed in the cylindrical volume at the cross-point between the second conductor 1222, and the plurality of first conductors 1201, while lines remain above the second conductor 1222.

FIG. 8D is a cross-section taken along the line A-A of FIG. 8A, along the stacked lines. In this cross-section, the surfactant spacers 2216, 2217 of the memory cells in the first level of cells are illustrated, confining bodies 2280 of phase change material between the surfactant spacers 2216, 2217.

The deep etch at this stage can be separated into two etch steps with separate alignment masks to reduce the aspect ratio of the deep trenches for some embodiments. The first etch may be executed before deposition of the materials for lines 1223, 1224, 1225, and the second etch after deposition the materials for lines 1223, 1224, 1225.

FIG. 9A is an aerial layout view of an X-Y plane; FIG. 9B is a cross-section view of a Y-Z plane along line C-C shown in FIG. 9A; FIG. 9C is a cross-section view of an X-Z plane along line B-B shown in FIG. 9A; and FIG. 9D is a cross-section view of an X-Z plane along line A-A shown in FIG. 9A, in a succeeding stage of the process. Referring to FIG. 9A, the aerial view reveals a blanket deposition of a thin film 228 of silicon nitride (or silicon oxynitride) over the structure shown in FIGS. 8A-8D. The use of thin film can be omitted in some embodiments, by can result in improved performance when used in combination with phase change memory material. FIG. 9B shows the thin film 228 lining the sides of the trenches, forming confinement liners 230, 229 on the sides of the body 2280 of phase change material in the first level of the stacks. FIG. 9C illustrates that the thin film 228 lines the bottom of the trenches. FIG. 9D illustrates the thin film 228 over the top of the stacked lines that extend in the X-direction.

FIG. 10A is an aerial layout view of an X-Y plane; FIG. 10B is a cross-section view of a Y-Z plane along line C-C shown in FIG. 10A; FIG. 10C is a cross-section view of an X-Z plane along line B-B shown in FIG. 10A; and FIG. 10D is a cross-section view of an X-Z plane along line A-A shown in FIG. 10A in a succeeding stage of the process. At this stage, the process has included depositing an insulating fill material 235 between the lines, and applying a chemical mechanical polishing step or other planarizing step that stops on the upper surface of the silicon nitride thin film 228. Referring to FIG. 10A, the aerial view shows the lines extending in the X-direction covered by the thin film 228 of silicon nitride, separated by insulating fill material 235. FIG. 10B shows the structure with the insulating fill material 235 between the stacked lines, with an upper surface coplanar with the upper surface of the thin film 228. FIG. 10C illustrates the insulating fill material 235 fills the trenches between the lines. FIG. 10D shows the stacked lines extending in the X-direction in the upper level of the structure overlying the memory cell stacks in the cylindrical volumes at the cross-points.

FIG. 11A is an aerial layout view of an X-Y plane; FIG. 11B is a cross-section view of a Y-Z plane along line C-C shown in FIG. 11A; FIG. 11C is a cross-section view of an X-Z plane along line B-B shown in FIG. 11A; and FIG. 11D is a cross-section view of an X-Z plane along line A-A shown in FIG. 11A, in a succeeding stage of the process. At this stage, the thin film 228 and hard mask line 1225 on the top of the patterned lines is pulled out by a selective etching process, leaving recesses 240 on the top of the stacked lines exposing the barrier material lines 1224. The recesses 240 have sidewalls that are self-aligned with the sides of the insulating fill material 235 and, as a result, are self-aligned with some offset determined by the thickness of the thin film liners 228a, 228b, with the sides of the lines 1222 of second conductor material. The remaining parts of the silicon nitride thin film include liners 228a, 228b on the sides of the insulating fill material 235 in the trenches, and contacting the first and second opposing sides of the body 2280 of phase change memory material in the memory cell stacks in the lower level of the structure. Referring to FIG. 11A, the aerial view shows the lines 1224 of the conductive barrier material and the liners 228a and 228b in the lines extending in the X-direction, with insulating fill material 235 between the lines. The recess 240 that results from removal of the silicon nitride hard mask lines 1225 and the thin film 228 on the top of the lines is best seen in FIG. 11B. FIG. 11C illustrates the insulating fill material 235 remains intact. The cross-section shown in FIG. 11D illustrates removal of the silicon nitride hard mask line 1225 and the thin film 228 over the top of the lines.

FIG. 12A is an aerial layout view of an X-Y plane; FIG. 12B is a cross-section view of a Y-Z plane along line C-C shown in FIG. 12A; FIG. 12C is a cross-section view of an X-Z plane along line B-B shown in FIG. 12A; and FIG. 12D is a cross-section view of an X-Z plane along line A-A shown in FIG. 12A, in a succeeding stage of the process. At this stage, a manufacturing process has included formation of spacers 1241, 1242 within the recesses. The spacers 1241, 1242 are formed by a blanket deposition of the surfactant spacer material followed by anisotropic etching using an etch chemistry selected for the surfactant spacer material over the fill material, and the conductive barrier layer, to remove the material over the flat top of the insulating fill material 235 and flat bottoms of the trenches beneath the insulating fill material 235, while leaving the lines of sidewall spacers 1241, 1242 is illustrated. Referring to FIG. 12A the aerial view reveals lines of the sidewall surfactant spacer lines 1241, 1242 with underlying conductive barrier material lines 1224 exposed beneath the lines of the sidewall spacer material. FIG. 12B illustrates the lines 1241, 1242 of surfactant spacer material on the top of the conductive barrier lines 1224, and aligned with the sides of the insulating fill material 235 in the upper level of the structure. FIG. 12C shows the insulating fill material 235 between the lines. FIG. 12D is taken on a cross-section between the alignment spacers, and shows that the upper surface of the conductive barrier line 1224 is revealed between the spacers.

FIG. 13A is an aerial layout view of an X-Y plane; FIG. 13B is a cross-section view of a Y-Z plane along line C-C shown in FIG. 13A; FIG. 13C is a cross-section view of an X-Z plane along line B-B shown in FIG. 13A; and FIG. 13D is a cross-section view of an X-Z plane along line A-A shown in FIG. 13A, in a succeeding stage of the process. At this stage, a blanket layer 245 of phase change material is deposited over the structure, and etched back to a level coplanar with the upper surfaces of the spacers 1241 and 1242. Referring to FIG. 13A, the aerial view shows the blanket layer 245 overlying the plurality of lines formed in the preceding stages. In FIG. 13B, the cross-section view taken on line C-C shows phase change material blanket layer 245 including a phase change material line 1246 confined between the spacers 1241, 1242 along the lines between the insulating fill material 235. As mentioned above, during the deposition of the blanket layer 245, the composition of the phase change material can be changed as suits a particular implementation, so that there may be variations in the concentrations of various elements to the depth of the structure. FIG. 13C illustrates the insulating fill material 235 after etch back of the phase change material. FIG. 13D shows the phase change material line 1281 extending on the line between the surfactant spacer lines 1241, 1242, and in contact with the conductive barrier line 1224.

Figure 14B:
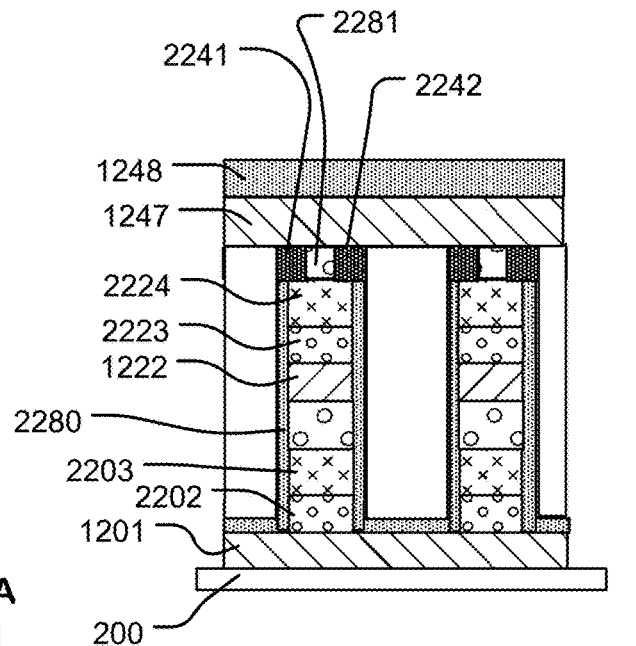
Figure 14A:
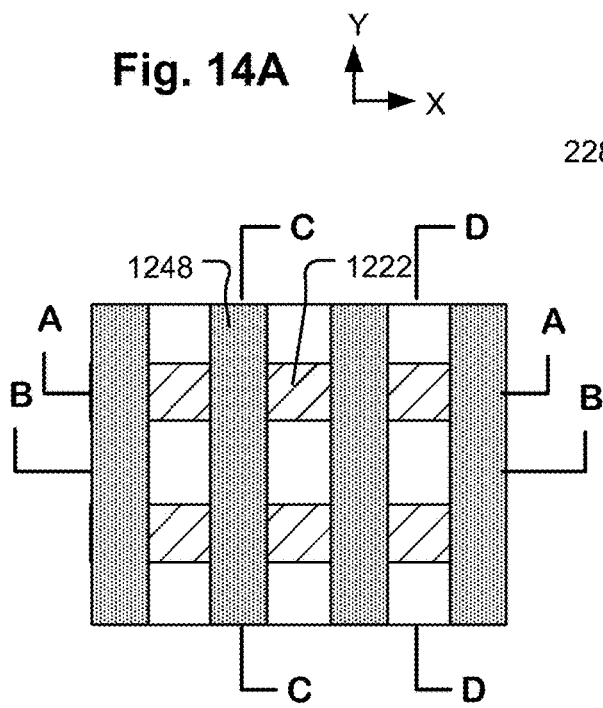
Figure 14C:
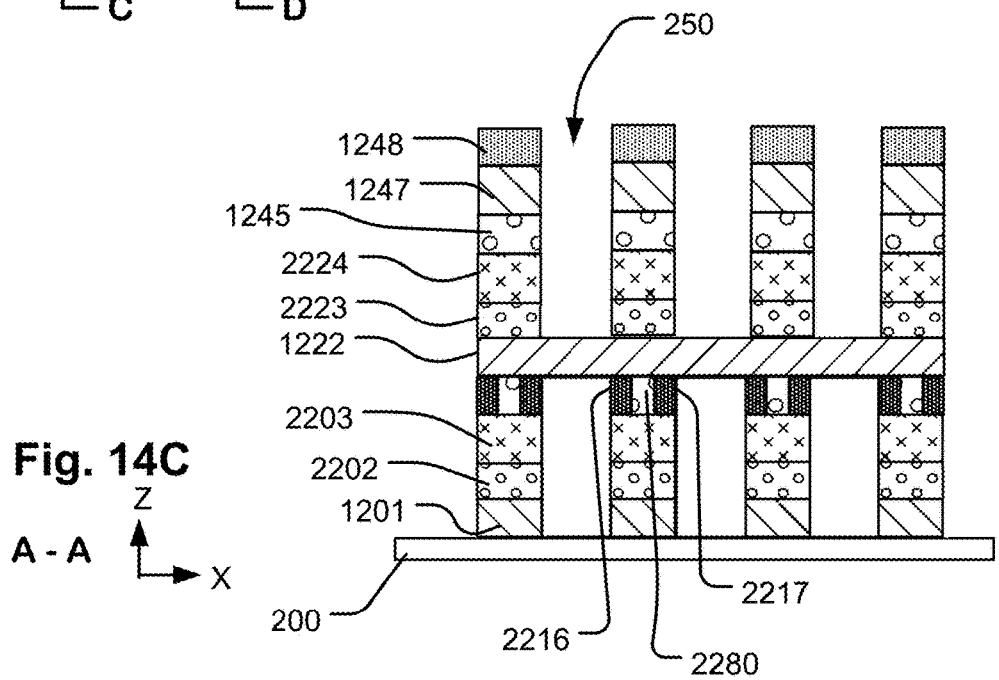

FIG. 14A is an aerial layout view of an X-Y plane; FIG. 14B is a cross-section view of a Y-Z plane along line C-C shown in FIG. 14A; FIG. 14C is a cross-section view of a Y-Z plane along line A-A shown in FIG. 14A; FIG. 14D is a cross-section view of an X-Z plane along line D-D shown in FIG. 14A; and FIG. 14E is a cross-section view of an X-Z plane along line B-B shown in FIG. 14A, in a succeeding stage of the process. At this stage, the process has included a blanket deposition of a hard mask material 1248 such as silicon nitride, and patterning using the hard mask material 1248 to form lines 1248 extending in the Y-direction separated by trenches 250 that extend down to the second conductors 1222, thereby forming a second level of memory cell stacks (body of phase change material 2281, conductive barrier element 2224, switching element 2223) in the cross-points between third conductors 1247 extending in the Y-direction and the second conductors 1221 extending in the X-direction. Referring to FIG. 14A, the aerial view shows the lines extending in the Y-direction covered by the hard mask material lines 1248, separated by trenches which reveal the upper surface of the second conductors 1221 that extend in the X-direction.

FIG. 14B illustrates third conductor 1247 extending in the Y-direction over memory cell stacks in first and second levels of the structure. FIG. 14C which is rotated by 90° relative to FIG. 14B illustrates that the second conductors 1222 extend in the X-direction orthogonal to the third conductors 1247 and the first conductors 1201 which extend in the Y-direction. Also, memory cell stacks disposed in a first level between the first conductors 1201 and the second conductors 1222, and in a second level between the third conductors 1247 and the second conductors 1222. The body 2281 of phase change material between the spacers 2241, 2242 forming a confined cell structure, and other elements of the stack lie within the cylindrical volume at the cross-point from the line 1247 having sides aligned with the sides of the third conductor 1247, as seen in FIG. 14C.

FIG. 14D illustrates that the trenches 250 formed extend between the lines extending in the Y-direction down to the upper surface of the lines 1222 which extend in the X-direction. FIG. 14E illustrates structures outside of the memory cell stacks, which are separated by the insulating fill material 235.

FIG. 15A is an aerial layout view of an X-Y plane; FIG. 15B is a cross-section view of a Y-Z plane along line C-C shown in FIG. 15A; FIG. 15C is a cross-section view of a Y-Z plane along line A-A shown in FIG. 15A; FIG. 15D is a cross-section view of an X-Z plane along line D-D shown in FIG. 15A; and FIG. 15E is a cross-section view of an X-Z plane along line B-B shown in FIG. 15A, in a succeeding stage of the process. In this stage, the process has included a deposition of a thin film liner 251 of the silicon nitride or other confinement liner material over the structure, followed by applying an insulating fill 252 and planarizing the structure so that the upper surface of the insulating fill 252 is coplanar with the upper surface of the liner 251. Referring to FIG. 15A, the aerial view reveals lines extending in the Y-direction covered by the thin film liner 251 of silicon nitride or other confinement liner material separated by insulating fill 252. FIG. 15B shows the thin film liner 251 over the top of the lines extending in the Y-direction. FIG. 15C shows the liner 251 lining the sidewalls of the trenches aligned with the memory cell stacks, and confining the phase change memory material bodies 2281 for the stacks in the upper level of the structure. FIG. 15D shows the insulating fill 252 over the liner 251 in the trenches between the lines. FIG. 15E shows the liner 251 lining the trenches between the memory cell stacks.

In an alternative embodiment, making more levels of memory cell stacks, the process can include removal of the hard mask lines 1248, and planarizing the structure down to the upper surface of the third conductors 1247 to form a flat surface for continuing the formation of additional levels of cross-point arrays of memory cell stacks.

FIG. 15B and FIG. 15C show the structures of the memory cell stacks in first and second levels of the array. The memory cell stacks are similar except rotated by 90° relative to one another, so that the surfactant spacers 2216, 2217 in the first level extend in the Y-direction and the surfactant spacers 2241, 2242 in the second level extend in the X-direction.

The memory cell stacks in the first level include a body 2280 of phase change material between surfactant spacers 2216 and 2217 on opposing sides of the memory cell stack that are aligned with the sides of the conductor 1201 which extends in the Y-direction. Also, in the first level of memory cell stacks, the body 2280 of phase change material between the surfactant spacers 2216, 2217 is confined on a second pair of opposing sides by the insulating confinement liner 230, 231 that is aligned with the conductor 1222 which extends in the X-direction. In the second level, the memory cell stacks include a body 2281 of phase change material between surfactant spacers 2241, 2242 (FIG. 15B) on opposing sides of the memory cell stack that are aligned with the sides of the conductor 1222 which extends in the X-direction. Also, in the second level of memory cell stacks, the body 2281 of phase change material between the surfactant spacers 2241, 2242 is confined on a second pair of opposing sides by the confinement liner 261, 262 (FIG. 15C—parts of the thin film 251) on the sidewalls.

Thus, as a result of the procedures described, a multilevel cross-point architecture is provided in which the memory cell stacks comprise confined bodies of programmable resistance material having cross-sectional areas that are substantially less than the cross-sectional area of the memory cell stacks in the cylindrical volume defined by the widths of the conductors at the cross-points.

Figure 16:
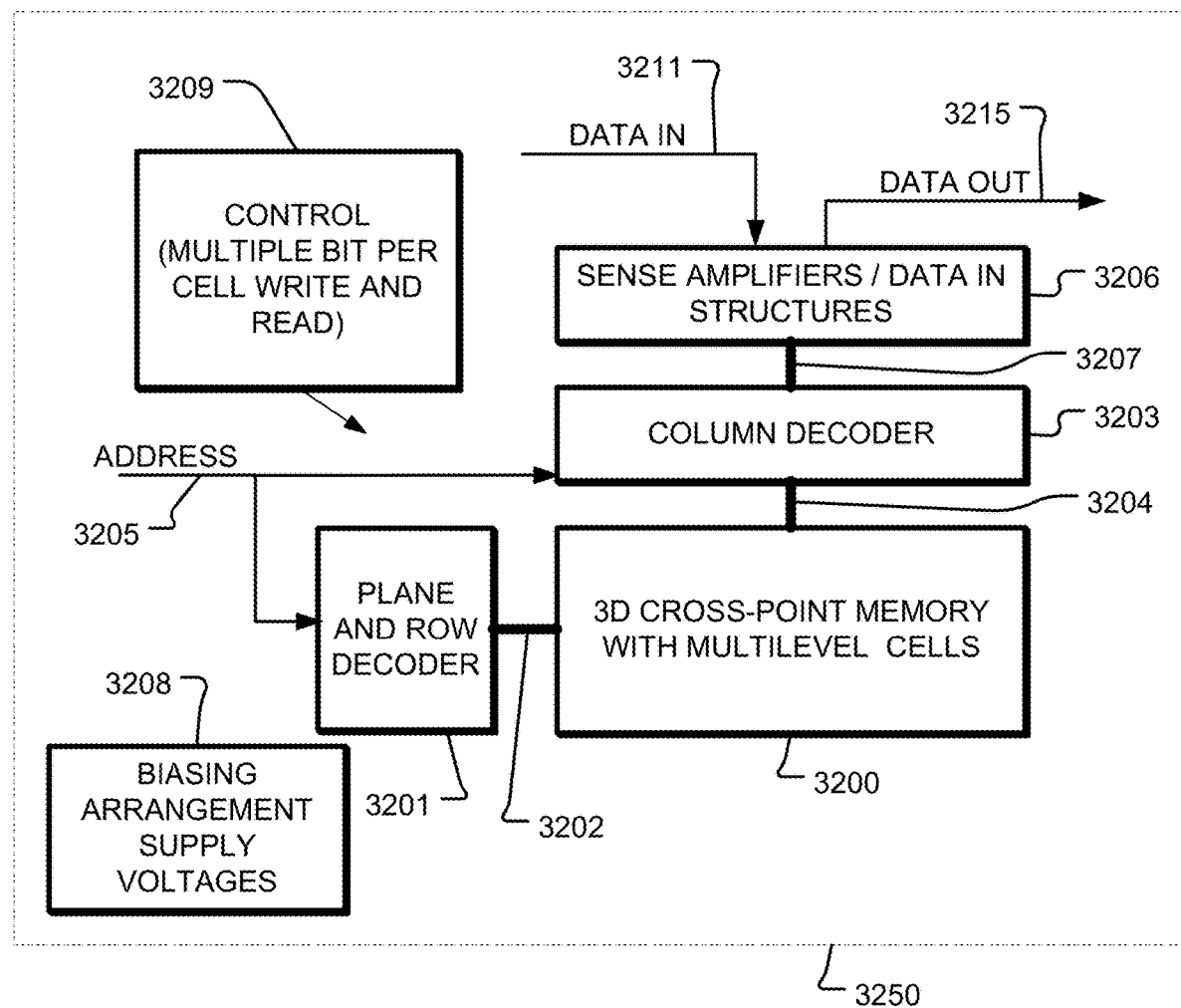
FIG. 16 is a block diagram of an integrated circuit with a 3D memory array having self-aligned 3D memory with confined cells, as described herein.

FIG. 16 shows an integrated circuit 3250 including a 3D memory array 3200 comprising memory cells including ovonic threshold switches in series with bodies of phase change material confined by surfactant spacers as described herein used for multilevel cells. A plane and row decoder 3201 is coupled to, and in electrical communication with, a plurality of word lines 3202, and arranged along rows in the memory array 3200. A column decoder 3203 is coupled to, and in electrical communication with, a plurality of bit lines 3204 arranged along columns in the memory array 3200 for reading data from, and writing data to, the memory cells in the 3D memory array 3200. Addresses are supplied on bus 3205 to the plane and row decoder 3201 and to the column decoder 3203. Sense amplifiers and other supporting circuitry such as pre-charge circuits and so on, along with data-in structures in block 3206, are coupled to the column decoder 3203 via the bus 3207. Data is supplied via the data-in line 3211 from input/output ports on the integrated circuit 3250 or other data sources, to the data-in structures in block 3206. Data is supplied via the data-out line 3215 from the sense amplifiers in block 3206 to input/output ports on the integrated circuit 3250, or to other data destinations internal or external to the integrated circuit 3250. Peripheral circuits on the integrated circuit are configured for reading and writing more than one bit per cell in at least parts of the 3D cross-point memory 3200. The peripheral circuitry can include a bias arrangement state machine in circuitry 3209, controlling biasing arrangement supply voltages 3208, and the sense circuitry and the data-in structures in block 3206, for read and write operations. Also, the peripheral circuitry includes control circuitry 3209 including logic such as state machines for read and write operations of the memory array 3200, including reading and writing more than one bit per cell. Incremental step pulse programming can be used for example to program multiple levels in the memory cells. Read logic with multiple read thresholds can be applied to read more than one bit per cell. The control circuitry 3209 can be implemented using special purpose logic, a general purpose processor or a combination thereof, configured to execute the read, write and erase operations.

A cross-point memory architecture and memory cell structure is provided in which the phase change material, or other programmable resistance material can be confined by silicon nitride, or other confinement material on four sides, which remains self-aligned with the volume in the cross-points of the array. Also, the memory cell retention is improved, and reset current magnitudes can be reduced.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of manufacturing an integrated circuit, comprising:
    forming a plurality of first conductors in a first conductor layer having sidewalls extending in a first direction, and a plurality of second conductors in a second conductor layer having sidewalls extending in a second direction and crossing over the first conductors at cross-points having cross-point areas defined by widths of the first and second conductors; and
    forming an array of memory cell stacks disposed in the cross-points between the first conductors and the second conductors, a memory cell stack in a corresponding cross-point in the array comprising:
        a switch element, a conductive barrier layer, and a confined cell structure in series, and having sides aligned within the cross-point area of the corresponding cross-point, the confined cell structure including surfactant spacers within the cross-point area having outside surfaces on opposing sides of the memory cell stack, and a body of programmable resistance memory material confined between inside surfaces of the surfactant spacers,
    wherein the memory cell stack includes layers of confinement material having outside surfaces on a second pair of opposing sides of the memory cell stack within the cross-point area at the corresponding cross-point.

2. The method of claim 1, including:
    forming a plurality of third conductors in a third conductor layer having sidewalls extending in the first direction, and over the second conductors at cross-points; and
    forming a second array of memory cell stacks disposed in the cross-points between the second conductors and the third conductors.

3. The method of claim 1, wherein forming the plurality of first conductors, the plurality of second conductors and the array of memory cell stacks, comprises:
    forming a first stack of materials, including a layer of material of the first conductors, a layer of material of the switch element, a layer of material of the conductive barrier and a sacrificial layer;
    etching first trenches through the first stack of materials to a level below the layer of material of the first conductors in a pattern defining the sidewalls of the first conductors;
    forming an insulating fill in the first trenches to a level coplanar with an upper surface of the sacrificial layer;
    removing the sacrificial layer to form a plurality of second trenches aligned with the sidewalls of the first conductors, and exposing the layer of material of the conductive barrier;
    forming the surfactant spacers on opposing sides of the second trenches to provide more narrow trenches within the second trenches;
    depositing programmable resistance memory material in the more narrow trenches;
    forming a second stack of materials comprising a layer of material of the second conductors; and
    etching third trenches through the second stack of materials to a level below the layer of material of the switch element in a pattern to define the second conductors, and the opposing sides of the memory cell stacks are aligned with the sidewalls of the second conductors.

4. The method of claim 3, including:
    before the etching the third trenches,
        the second stack of materials comprising the layer of material of the second conductors, a second layer of material of the switch element, a second layer of material of the conductive barrier and a second sacrificial layer;
    after the etching the third trenches,
        forming an insulating fill in the third trenches to a level coplanar with an upper surface of the second sacrificial layer;
        removing the second sacrificial layer to form a plurality of fourth trenches aligned with the sidewalls of the second conductors, and exposing the second layer of material of the conductive barrier;

forming second surfactant spacers on opposing sides of the fourth trenches to provide second more narrow trenches within the fourth trenches;

depositing programmable resistance memory material in the second more narrow trenches;

forming a third stack of materials; and etching fifth trenches through the third stack of materials to a level below the second layer of material of the switch element in a pattern to define a plurality of third conductors, and opposing sides of a second array of memory cell stacks are aligned with sidewalls of the third conductors.

5. The method of claim 3, wherein the surfactant spacers have an upper surface, and depositing programmable resistance memory material in the more narrow trenches includes forming the bodies of programmable resistance memory material having upper surfaces coplanar with the upper surface of the surfactant spacers.

6. The method of claim 1, the programmable resistance memory material comprising a phase change material, and the switch comprising an ovonic threshold switch.

7. The method of claim 1, the programmable resistance memory material comprising a phase change material.

8. The method of claim 1, wherein the switch element comprises an ovonic threshold switch.

9. The method of claim 1, wherein the surfactant spacers comprise a metal nitride.

10. The method of claim 1, wherein the surfactant spacers comprise a metal nitride, and the programmable resistance memory material comprises a phase change material.

11. A method of manufacturing an integrated circuit, comprising:

forming first conductors in a first conductor layer having sidewalls extending in a first direction, and second conductors in a second conductor layer having sidewalls extending in a second direction and crossing over the first conductors at cross-points having cross-point areas defined by widths of the first and second conductors; and forming an array of memory cell stacks disposed in the cross-points between the first conductors and the second conductors, a memory cell stack in a corresponding cross-point in the array comprising:

a switch element, a conductive barrier layer, and a confined cell structure in series, and having sides aligned within the cross-point area of the corresponding cross-point, the confined cell structure including surfactant spacers within the cross-point area having outside surfaces aligned with a first pair of opposing sides of the memory cell stack, and a body of programmable resistance memory material confined between inside surfaces of the surfactant spacers, wherein the memory cell stack includes layers of confinement material having outside surfaces only on a second pair of opposing sides of the memory cell stack at the corresponding cross-point.

* * * * *